(12) United States Patent
Nah et al.

(10) Patent No.: US 10,692,795 B2
(45) Date of Patent: Jun. 23, 2020

(54) FLIP CHIP ASSEMBLY OF QUANTUM COMPUTING DEVICES

(71) Applicant: International Business Machines Corporation, Armonk, NY (US)

(72) Inventors: Jae-Woong Nah, Closter, NJ (US); Hanhee Paik, Danbury, CT (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/188,466

(22) Filed: Nov. 13, 2018

(65) Prior Publication Data

US 2020/0152540 A1 May 14, 2020

(51) Int. Cl.
*H01L 23/48* (2006.01)
*H01L 23/52* (2006.01)
(Continued)

(52) U.S. Cl.
CPC .......... *H01L 23/367* (2013.01); *G06N 10/00* (2019.01); *H01L 23/49816* (2013.01);
(Continued)

(58) Field of Classification Search
CPC ............... H01L 23/36; H01L 23/49816; H01L 23/3107; H01L 23/4334; H01L 23/367;
(Continued)

(56) References Cited

U.S. PATENT DOCUMENTS 6,727,576 B2 4/2004 Hedler et al.
7,449,780 B2 11/2008 Hue et al.
(Continued)

FOREIGN PATENT DOCUMENTS

| JP | 2014179394 A | 9/2014 |
| WO | 2018057024 A1 | 3/2018 |
| WO | 2018063204 A1 | 4/2018 |

OTHER PUBLICATIONS

K.E. Yokoyama et al., Robust Superconducting Die Attach Process, Jun. 1997.
(Continued)

*Primary Examiner* — Theresa T Doan
(74) *Attorney, Agent, or Firm* — Garg Law Firm, PLLC; Rakesh Garg; Keivan Razavi

(57) ABSTRACT

In an embodiment, a quantum device includes an interposer layer comprising a set of vias. In an embodiment, the quantum device includes a dielectric layer formed on a first side of the interposer, the dielectric layer including a set of transmission lines communicatively coupled to the set of vias. In an embodiment, the quantum device includes a plurality of qubit chips coupled to an opposite side of the interposer layer, each qubit chip of the plurality of qubit chips including: a plurality of qubits on a first side of the qubit chip and a plurality of protrusions on a second side of the qubit chip. In an embodiment, the quantum device includes a heat sink thermally coupled with the plurality of qubit chips, the heat sink comprising a plurality of recesses aligned with the plurality of protrusions of the plurality of qubit chips.

11 Claims, 21 Drawing Sheets

(51) Int. Cl.
*H01L 23/367* (2006.01)
*H01L 39/22* (2006.01)
*H01L 23/544* (2006.01)
*H01L 23/00* (2006.01)
*H01L 39/04* (2006.01)
*G06N 10/00* (2019.01)
*H01L 23/498* (2006.01)

(52) U.S. Cl.
CPC ............ *H01L 23/544* (2013.01); *H01L 24/08* (2013.01); *H01L 39/045* (2013.01); *H01L 39/223* (2013.01); *H01L 2223/54426* (2013.01); *H01L 2224/08225* (2013.01)

(58) Field of Classification Search
CPC ..... H01L 23/3121; H01L 24/05; H01L 24/81; H01L 23/373; H01L 23/48; H01L 23/49503; H01L 24/08; H01L 33/52; H01L 33/62; H01L 39/045; H01L 49/006; H01L 39/223; H01L 31/035209; H01L 31/055218; H01L 31/035227
USPC ........................................................ 257/690
See application file for complete search history.

(56) References Cited

U.S. PATENT DOCUMENTS

| | | | |
|---|---|---|---|
| 8,159,825 | B1 | 4/2012 | Dotsenko |
| 9,000,584 | B2 | 4/2015 | Lin et al. |
| 9,524,470 | B1 | 12/2016 | Chow et al. |
| 9,836,699 | B1 | 12/2017 | Rigetti et al. |
| 10,305,015 | B1* | 5/2019 | Brink .................. H01L 25/0657 |
| 2004/0040327 | A1 | 3/2004 | Iida et al. |
| 2018/0012932 | A1 | 1/2018 | Oliver et al. |
| 2018/0190638 | A1 | 7/2018 | Chen et al. |
| 2020/0012961 | A1* | 1/2020 | Kelly .................. H01L 23/5225 |

OTHER PUBLICATIONS

M.B. Ketchen et al., A Josephson Technology System Level Experiment, Oct. 1981.

Das et al., "Cryogenic Qubit Integration for Quantum Computing", 2018 IEEE 68th Electronic Components and Technology Conference (ECTC), IEEE, May 29, 2018, pp. 504-514.

International Searching Authority, PCT/EP2019/080173, dated Feb. 4, 2020.

* cited by examiner

FLIP CHIP ASSEMBLY OF QUANTUM COMPUTING DEVICES

TECHNICAL FIELD

The present invention relates generally to a device, a fabrication method, and fabrication system for assembly of quantum computing devices. More particularly, the present invention relates to a device, method, and system for flip chip assembly of quantum computing devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The presently available quantum circuits are formed using materials that become superconducting at cryogenically low temperatures, e.g., at about 10-100 millikelvin (mK), or about 4 K. The external circuits that connect to a quantum circuit usually operate at room temperature (approximately 270-300 K) or higher. The connections between an external circuit and a q-circuit, e.g., an input line to the q-circuit or an output line from the q-circuit, or both, must therefore be thermally isolated from the external circuit's environment.

To provide this thermal isolation, the lines connecting to a q-circuit pass through a series of one or more dilution fridge stages (compactly referred to herein as "stage", plural "stages"). A dilution fridge is a heat-exchange device which causes a reduction in a temperature of a component as compared to the temperature at which the component is introduced into the dilution fridge, maintains the component at a designated reduced temperature, or both. For example, a dilution fridge stage may reduce the temperature of an input line to a q-circuit and another dilution fridge stage down the line in a series of dilution fridge stages may house the q-circuit.

A signal on a line passing through a stage can contain noise. This noise can be in the microwave frequency spectrum. For the reasons described herein, microwave frequency noise is undesirable when the line and signals relate to quantum computing using q-circuits.

Flip chip assembly is a method of interconnecting an electronic device with external circuitry by metallic solder bumps deposited onto pads of the electronic device. Pads on the electronic device are aligned with matching pads on the external circuitry.

The illustrative embodiments recognize certain disadvantages with the presently available methods for quantum device assembly. For example, in most cases, the presently available methods do not provide positional accuracy to ensure pads on the electronic device are aligned with matching pads on the external circuitry. Additionally, the presently available methods do not effectively transfer heat away from the quantum device.

SUMMARY

The illustrative embodiments provide a quantum computing device, and a method and system of fabrication therefor. A device of an embodiment includes an interposer layer comprising a set of vias. In an embodiment, the quantum device includes a dielectric layer formed on a first side of the interposer, the dielectric layer including a set of transmission lines communicatively coupled to the set of vias. In an embodiment, the quantum device includes a plurality of qubit chips coupled to an opposite side of the interposer layer, each qubit chip of the plurality of qubit chips including: a plurality of qubits on a first side of the qubit chip and a plurality of protrusions on a second side of the qubit chip.

In an embodiment, the quantum device includes a heat sink thermally coupled with the plurality of qubit chips, the heat sink comprising a plurality of recesses aligned with the plurality of protrusions of the plurality of qubit chips. In an embodiment, the device includes a signal connector communicatively coupled to the set of transmission lines. In an embodiment, a shape of the plurality of protrusions is configured to self-align the plurality of protrusions with the plurality of recesses. In an embodiment, the device includes a second heat sink coupled to the dielectric layer. In an embodiment, the plurality of protrusions have a pyramidal shape.

In an embodiment, the device includes a first set of pads on the plurality of qubit chips, each pad connected to a corresponding qubit. In an embodiment, the device includes a second set of pads on the interposer layer, the second set of pads formed on the vias.

In an embodiment, the device includes a first layer disposed on the second set of pads. In an embodiment, the device includes a set of solder bumps disposed on the first layer, the set of solder bumps configured to bond the first set of pads and the second set of pads. In an embodiment, the set of solder bumps is of at least one member selected from a set comprising Indium, Tin, and Bismuth. In an embodiment, the second layer is of at least one member selected from a set comprising Titanium and Gold.

In an embodiment, the device includes a first layer disposed on the plurality of protrusions of the plurality of qubit chips. In an embodiment, a second layer disposed on the plurality of recesses of the heat sink. In an embodiment, the first layer is of at least one member selected from a set comprising Titanium, Silver, Copper, Platinum, and Gold. In an embodiment, the second layer is of at least one member selected from a set comprising Titanium, Silver, Copper, Platinum, and Gold.

An embodiment includes a fabrication method for fabricating the device. In an embodiment, the method includes forming an interposer layer comprising a set of vias. In an embodiment, the method includes forming a dielectric layer formed on a first side of the interposer, the dielectric layer including a set of transmission lines communicatively coupled to the set of vias. In an embodiment, the method includes forming a plurality of protrusions on a plurality of qubit chips.

In an embodiment, the method includes coupling the plurality of qubit chips to an opposite side of the interposer layer. In an embodiment, the method includes forming a plurality of recesses on a heat sink. In an embodiment, the method includes coupling the plurality of qubit chips to the heat sink, the plurality of recesses aligned with the plurality of protrusions.

In an embodiment, the method includes coupling a signal connector communicatively to the set of transmission lines. In an embodiment, the method includes, attaching a handler on the dielectric layer using a temporary adhesive to thin down the interposer layer and exposing the set of vias at opposite side. In an embodiment, the method includes detaching the handler from the interposer layer after bonding the plurality of qubit chips on the interposer layer.

In an embodiment, the method includes depositing a first set of pads on the plurality of qubit chips. In an embodiment, the method includes depositing a second set of pads on the interposer layer, the second set of pads deposited on the vias. In an embodiment, the method includes depositing a first layer on the second set of pads. In an embodiment, the method includes depositing a set of solder bumps on the first layer, the set of solder bumps configured to bond the first set of pads and the second set of pads.

In an embodiment, the method includes depositing a first layer on the plurality of protrusions of the plurality of qubit chips. In an embodiment, the method includes depositing a second layer on the plurality of recesses of the heat sink.

In an embodiment, the first layer is of at least one member selected from a set comprising Titanium, Silver, Copper, Platinum, and Gold. In an embodiment, the second layer is of at least one member selected from a set comprising Titanium, Silver, Copper, Platinum, and Gold. In an embodiment, a shape of the plurality of protrusions is configured to self-align the plurality of protrusions with the plurality of recesses.

An embodiment includes a fabrication system for fabricating the device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
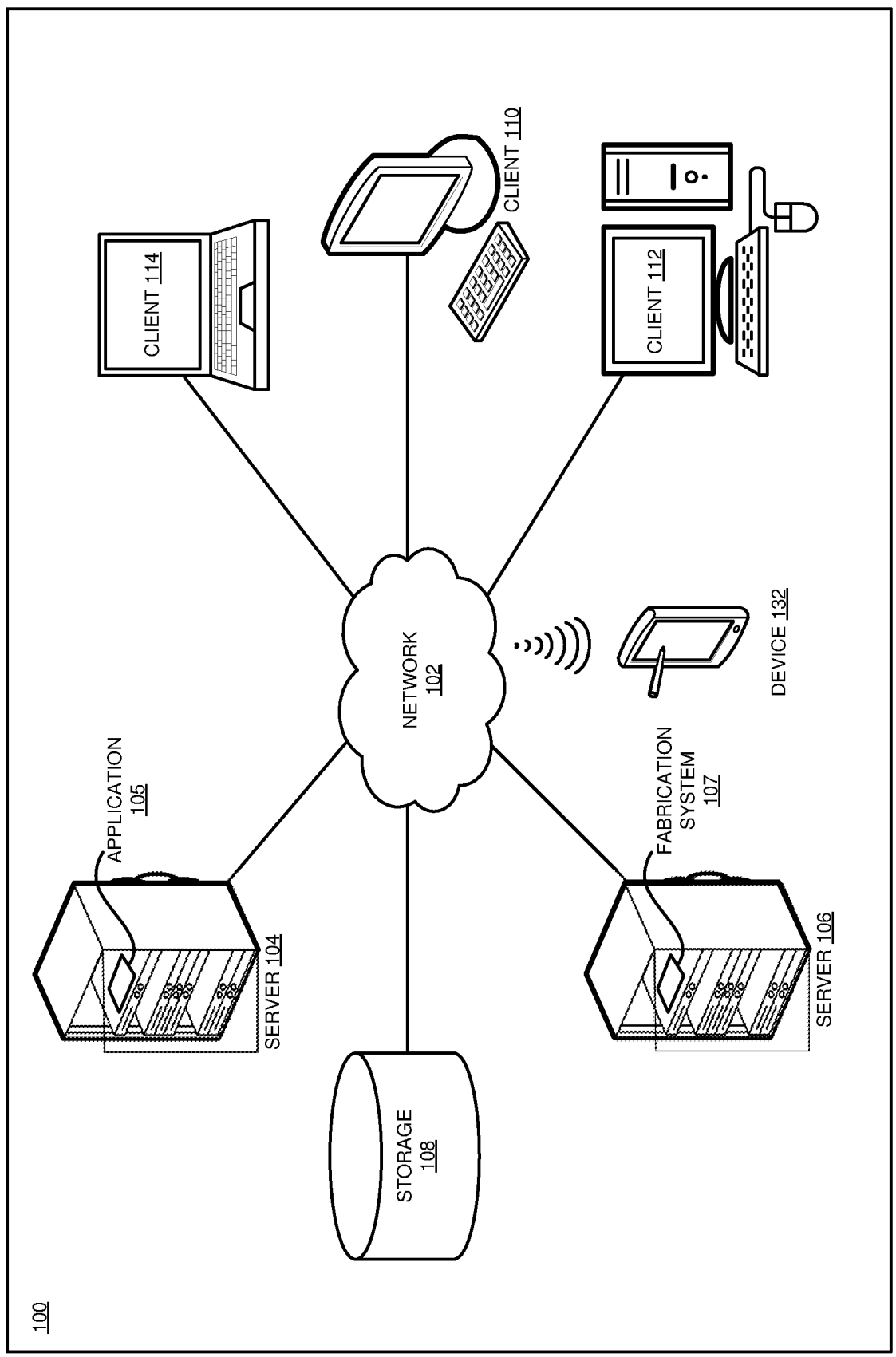
FIG. 1 depicts a block diagram of a network of data processing systems in which illustrative embodiments may be implemented.

The illustrative embodiments used to describe the invention generally address and solve the above-described needs for quantum device assembly. The illustrative embodiments provide a method for quantum device assembly, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of quantum computing device. Another embodiment provides a fabrication method for the quantum computing device, such that the method can be implemented as a software application. The application implementing a fabrication method embodiment can be configured to operate in conjunction with an existing fabrication system—such as a lithography system, or a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example device components are used in the figures and the illustrative embodiments. In an actual fabrication or circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a hybrid attenuator, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
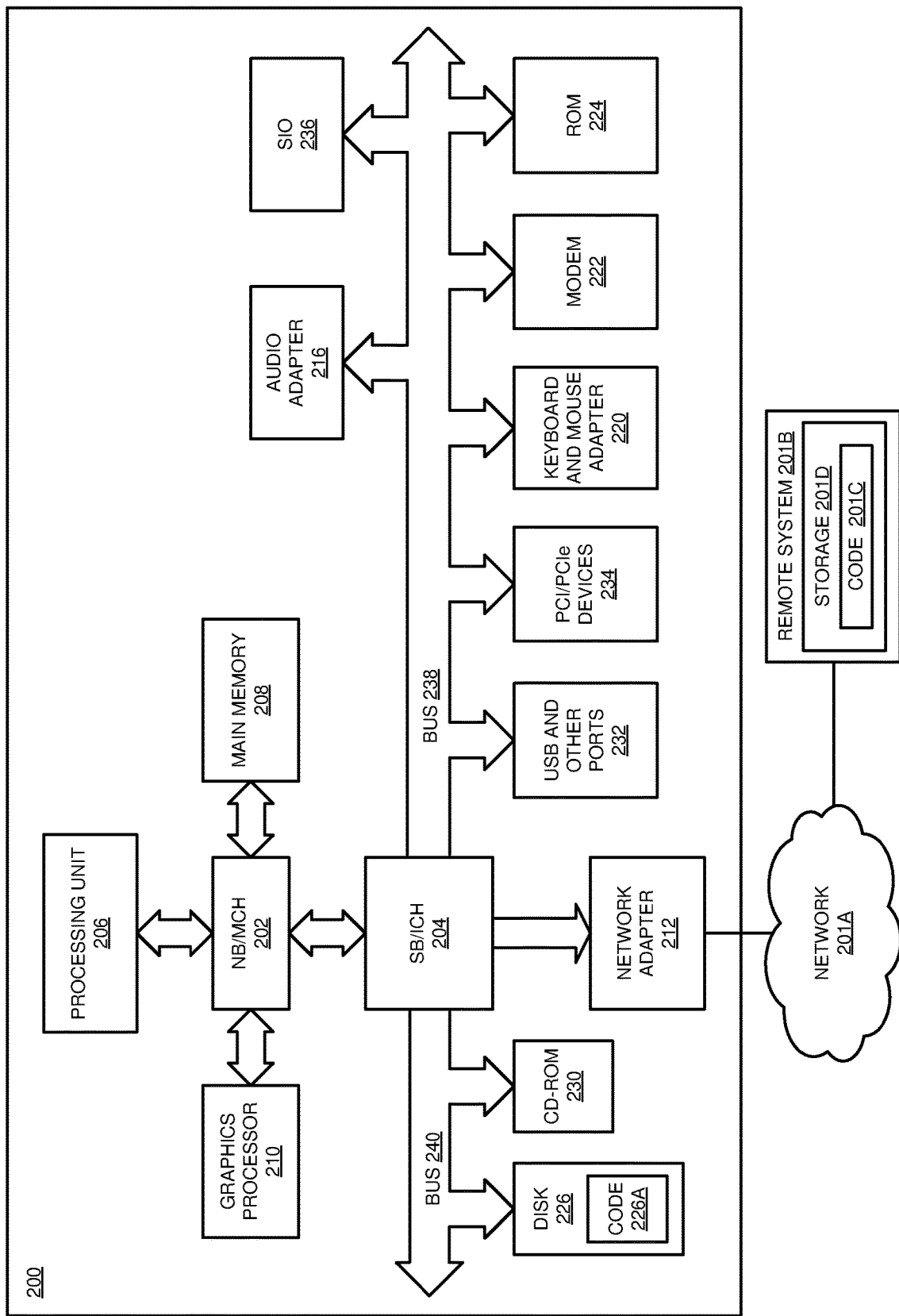
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a quantum device. Application 105 provides instructions to system 107 for flip chip assembly of quantum devices in a manner described herein.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs memory controller hub (NB/MCH) 202 and input/output (I/O) controller hub (SB/ICH) 204. Processing unit 206, main memory 208, and graphics processor 210 are coupled in the example manner shown in this figure. Local area network (LAN) adapter 212, audio adapter 216, keyboard and mouse adapter 220, modem 222, read only memory (ROM) 224, universal serial bus (USB) and other ports 232, and PCI/PCIe devices 234 are coupled through bus 238. Hard disk drive (HDD) or solid-state drive (SSD) 226 and CD-ROM 230 are coupled through bus 240. A super I/O (SIO) device 236 may be coupled through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

Instructions for applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

Figure 3:
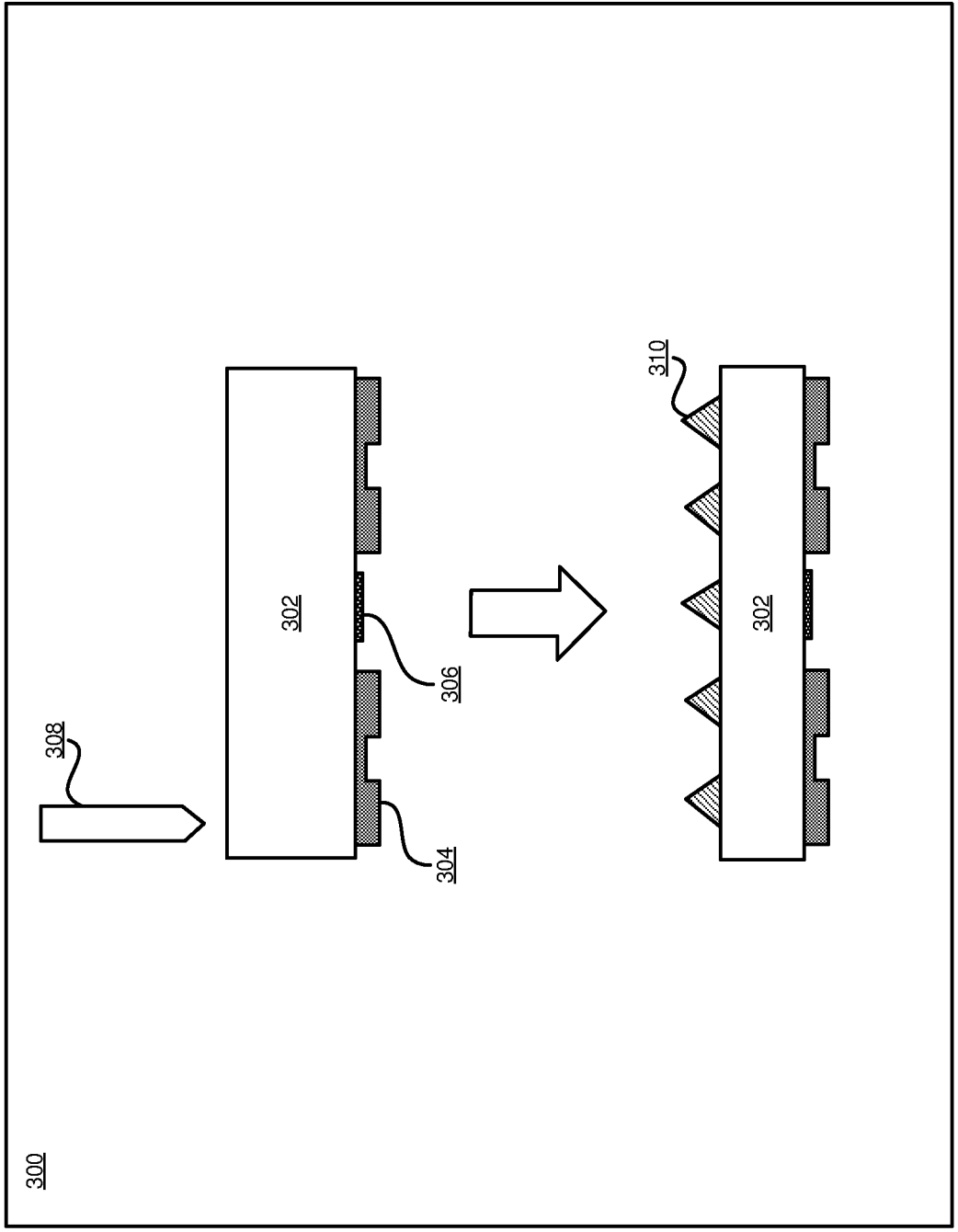
FIG. 3 depicts a block diagram of an example qubit chip in accordance with an illustrative embodiment.

With reference to FIG. 3, this figure depicts a block diagram of an example qubit chip in accordance with an illustrative embodiment. Application 105 in FIG. 1 interacts with fabrication system 107 to produce or manipulate configuration 300 as described herein.

Configuration 300 comprises substrate 302. Substrate 302 comprises a material with high thermal conductivity (above a threshold) in the cryogenic temperature range. In an embodiment, substrate 302 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, substrate 302 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming the substrate and the same are contemplated within the scope of the illustrative embodiments.

Configuration 300 also comprises at least one pad 304 and at least one junction 306. An embodiment causes a fabrication system, such as fabrication system 107 in FIG. 1, to create a formation 310 on a backside of chip 300. For example, milling device 308 can be configured to remove a portion of the substrate 302 to create formation 310. As another example, deep reactive-ion etching can be used to create formation 310. In an embodiment, formation 310 includes a triangular cross-section. In an embodiment, formation 310 includes a plurality of protrusions. In an embodiment, milling device 306 is a micro-milling device with diamond milling bits or a laser mill. These examples of milling devices are not intended to be limiting. From this disclosure, those of ordinary skill in the art will be able to conceive of many other milling devices suitable for creating a formation on the backside of the qubit chip and the same are contemplated within the scope of the illustrative embodiments. Furthermore, from this disclosure, those of ordinary skill in the art will be able to conceive of many other devices and methods suitable for creating a formation in a backside of a qubit chip and the same are contemplated within the scope of the illustrative embodiments.

In an embodiment, substrate 302 is a portion of a wafer substrate comprising a set of qubit chips. In an embodiment, each qubit chip of the set of qubit chips include at least one pad and at least one junction. In an embodiment, each qubit chip includes a plurality of qubits. An embodiment causes fabrication system, such as fabrication system 107, to create a formation 310 on a backside of the wafer substrate. For example, milling device 308 can remove material from the wafer substrate to create formation 310 on the backside of the wafer substrate. As another examples, deep reactive-ion etching or anisotropic chemical etching can be used to create formation 310 on the backside of the wafer substrate.

Figure 4:
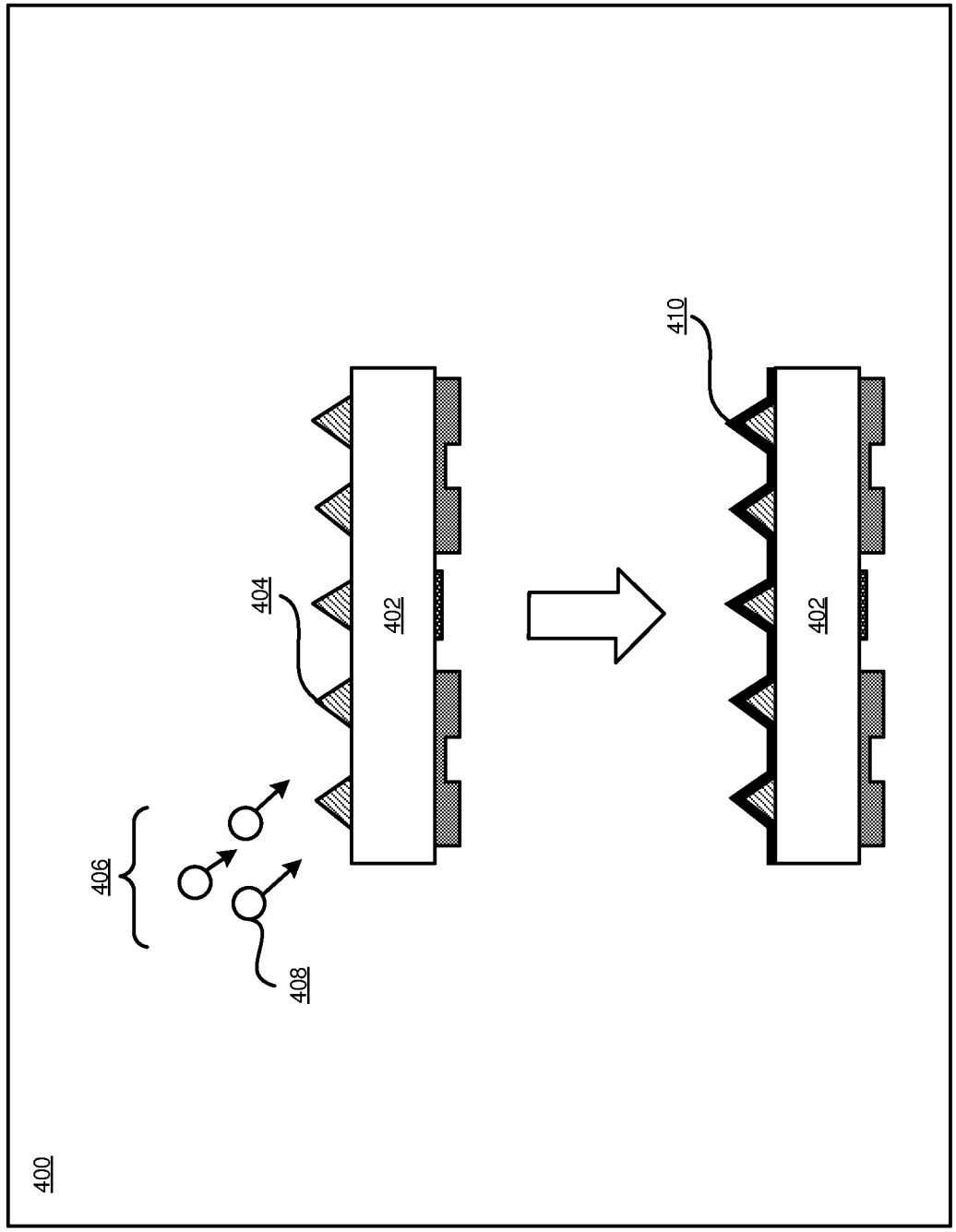
FIG. 4 depicts a block diagram of an example qubit chip configuration in accordance with an illustrative embodiment.

With reference to FIG. 4, this figure depicts a block diagram of an example qubit chip configuration in accordance with an illustrative embodiment. Application 105 in FIG. 1 interacts with fabrication system 107 to produce or manipulate configuration 400 as described herein.

An embodiment causes the fabrication system to deposit material 406, thus forming first layer 410. First layer 410 comprises material 406 with high thermal conductivity (above a threshold) in the cryogenic temperature range. In an embodiment, first layer 410 is formed using a material that exhibits a RRR of at least 100, and a thermal conductivity of greater than 1 W/(cm*K) at 4 Kelvin, threshold level of thermal conductivity. For example, first layer 410 may be formed using gold, silver, copper, titanium, or platinum for operations in the temperature range of 77 K to 0.01 K. These examples of layer materials are not intended to be limiting. From this disclosure, those of ordinary skill in the art will be able to conceive of many other materials suitable for forming the first layer and the same are contemplated within the scope of the illustrative embodiments.

In an embodiment, first layer 410 is deposited on a backside of configuration 400. For example, first layer 410 can be a thin film deposition of particles 408 on formation 404. In an embodiment, first layer 410 includes a thickness in a range of about 10 nm-1000 nm, inclusive of both ends of the range. This example of a deposition method is not intended to be limiting. From this disclosure, those of ordinary skill in the art will be able to conceive of many other methods and process suitable for forming the first layer and the same are contemplated within the scope of the illustrative embodiments.

Figure 5:
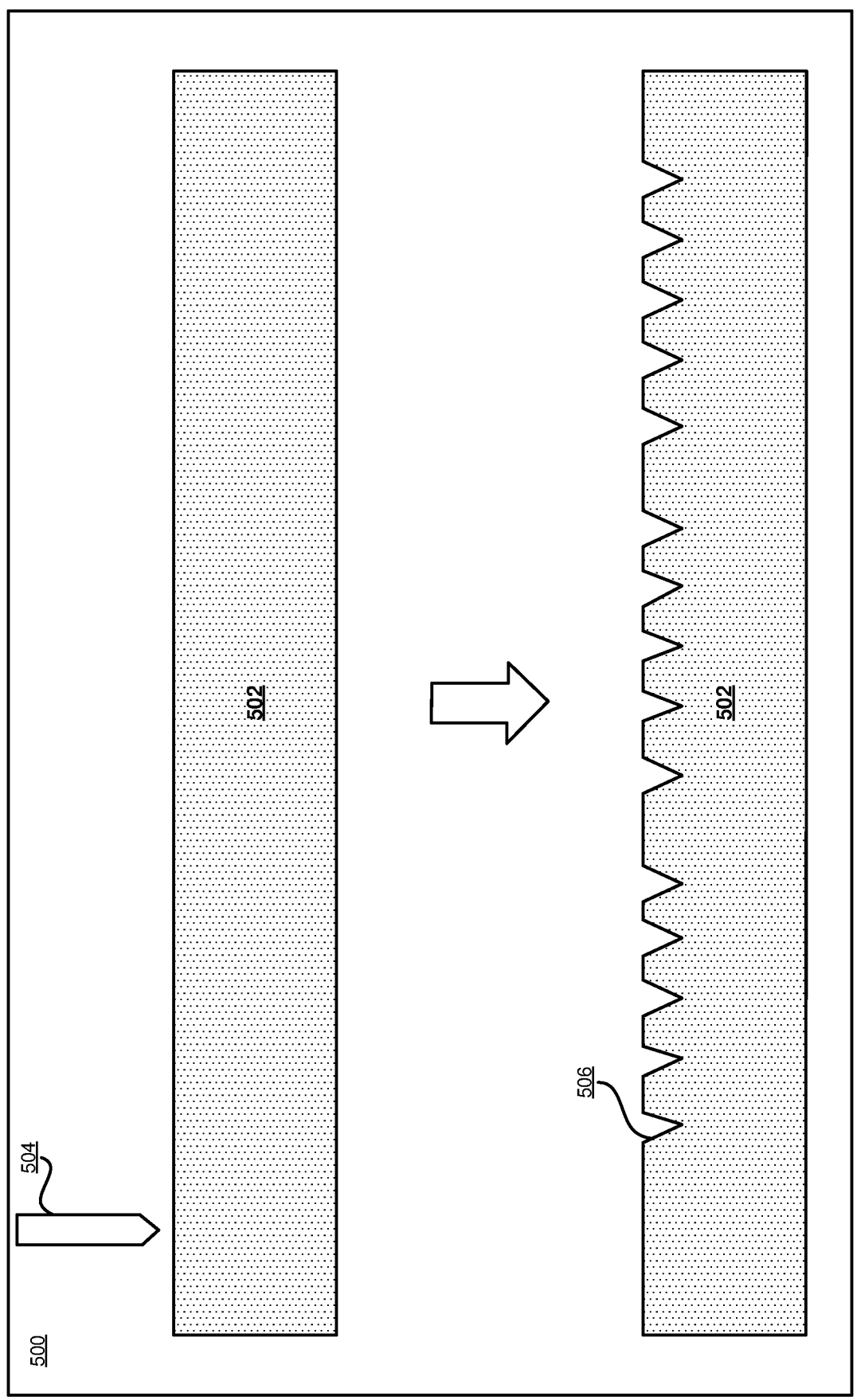
FIG. 5 depicts a block diagram of an example heat sink configuration in accordance with an illustrative embodiment.

With reference to FIG. 5, this figure depicts a block diagram of an example heat sink configuration in accordance with an illustrative embodiment. Application 105 in FIG. 1 interacts with fabrication system 107 to produce or manipulate configuration 500 as described herein.

Configuration 500 comprises heat sink 502. Heat sink 502 comprises a material with high thermal conductivity (above a threshold) in the cryogenic temperature range. In an embodiment, heat sink 502 is formed using a material that exhibits a RRR of at least 100, and a thermal conductivity of greater than a 1 W/(cm*K) at 4 Kelvin, threshold level of thermal conductivity. For example, heat sink 502 may be formed using gold, silver, copper, or aluminum for operations in the temperature range of 77 K to 0.01K. These examples of heat sink materials are not intended to be limiting. From this disclosure those of ordinary skill in the art will be able to conceive of many other materials suitable for forming the heat sink and the same are contemplated within the scope of the illustrative embodiments.

An embodiment causes a fabrication system, such as fabrication system 107 in FIG. 1, to create a formation 506 on a surface of heat sink 502. For example, milling device 504 can be configured to remove a portion of the heat sink 502 to create formation 506. As another example, etching can be used to create formation 506. In an embodiment, formation 506 includes a triangular cut-out. In an embodiment, formation 506 includes a plurality of recesses. In an embodiment, milling device 504 is a micro-milling device with diamond milling bits or a laser mill. These examples of milling devices are not intended to be limiting. From this disclosure, those of ordinary skill in the art will be able to conceive of many other milling devices suitable for creating a formation on the heat sink and the same are contemplated within the scope of the illustrative embodiments. Furthermore, from this disclosure, those of ordinary skill in the art will be able to conceive of many other devices and methods suitable for creating a formation on the heat sink and the same are contemplated within the scope of the illustrative embodiments.

Figure 6:
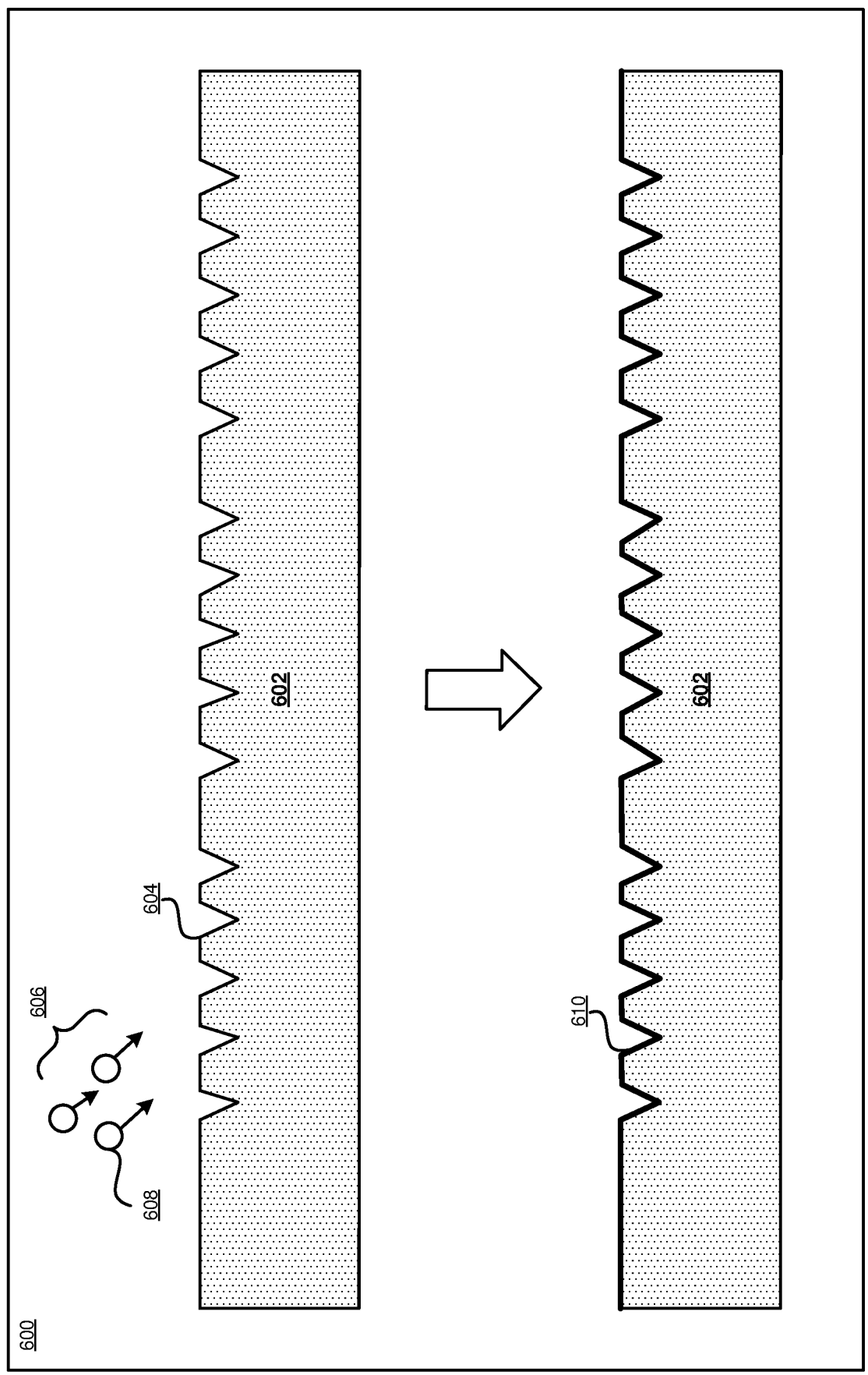
FIG. 6 depicts a block diagram of an example heat sink configuration in accordance with an illustrative embodiment.

With reference to FIG. 6, this figure depicts a block diagram of an example heat sink configuration in accordance with an illustrative embodiment. Application 105 in FIG. 1 interacts with fabrication system 107 to produce or manipulate configuration 600 as described herein.

An embodiment causes the fabrication system to deposit material 606, thus forming first layer 610. First layer 610 comprises material 606 with high thermal conductivity (above a threshold) in the cryogenic temperature range. In an embodiment, first layer 610 is formed using a material that exhibits a RRR of at least 100, and a thermal conductivity of greater than 1 W/(cm*K) at 4 Kelvin, threshold level of thermal conductivity. For example, first layer 610 may be formed using gold, silver, copper, titanium, or platinum for operations in the temperature range of 77 K to 0.01 K. These examples of layer materials are not intended to be limiting. From this disclosure, those of ordinary skill in the art will be able to conceive of many other materials suitable for forming the first layer and the same are contemplated within the scope of the illustrative embodiments.

In an embodiment, first layer 610 is deposited on heat sink 602 of configuration 600. For example, first layer 610 can be a thin film deposition of particles 608 on formation 604. In an embodiment, first layer 610 includes a thickness in a range of about 10 nm-1000 nm, inclusive of both ends of the range. This example of a deposition method is not intended to be limiting. From this disclosure, those of ordinary skill in the art will be able to conceive of many other methods and process suitable for forming the first layer and the same are contemplated within the scope of the illustrative embodiments.

Figure 7:
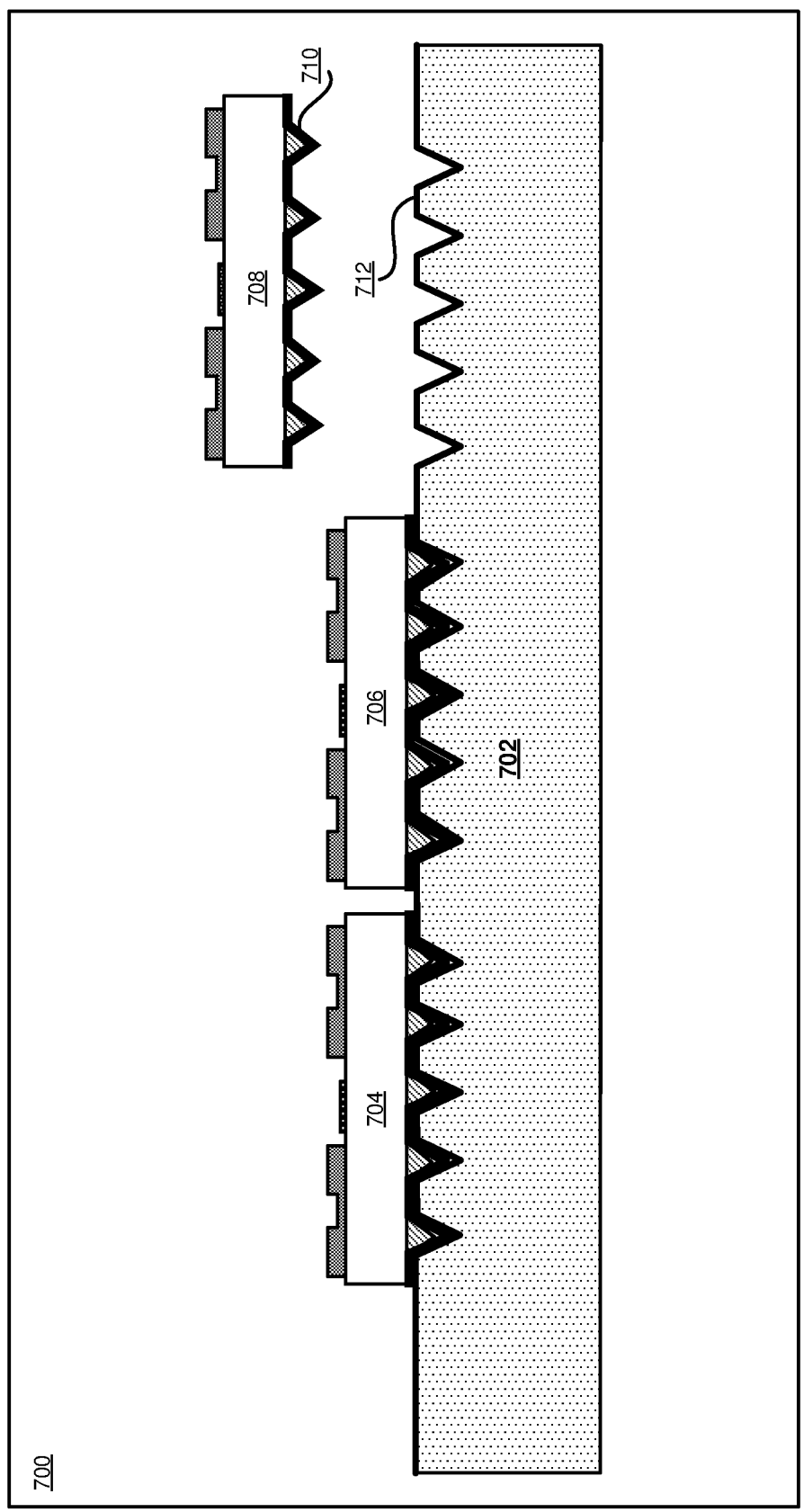
FIG. 7 depicts a block diagram of an example heat sink configuration in accordance with an illustrative embodiment.

With reference to FIG. 7, this figure depicts a block diagram of an example heat sink configuration in accordance with an illustrative embodiment. Application 105 in FIG. 1 interacts with fabrication system 107 to produce or manipulate configuration 700 as described herein.

An embodiment causes the fabrication system to couple a set of qubit chips 704, 706, 708 to heat sink 702. In an embodiment, qubit chips 704, 706, 708 are similar to qubit chip configuration 400 in FIG. 4. In an embodiment, heat sink 702 is similar to heat sink 602 in FIG. 6. Qubit chips 704, 706, 708 comprise a formation 710. Heat sink 702 comprises a formation 712. In an embodiment, formation 712 corresponds to a complementary shape to formation 710. For example, formation 712 comprises a plurality of recesses configured to receive a plurality of protrusions of formation 710. In an embodiment, formation 710 is configured to self-align the corresponding qubit chip with a corresponding coupling site of the formation 712 during coupling. For example, fabrication system can compression bond formation 710 in formation 712.

Figure 8:
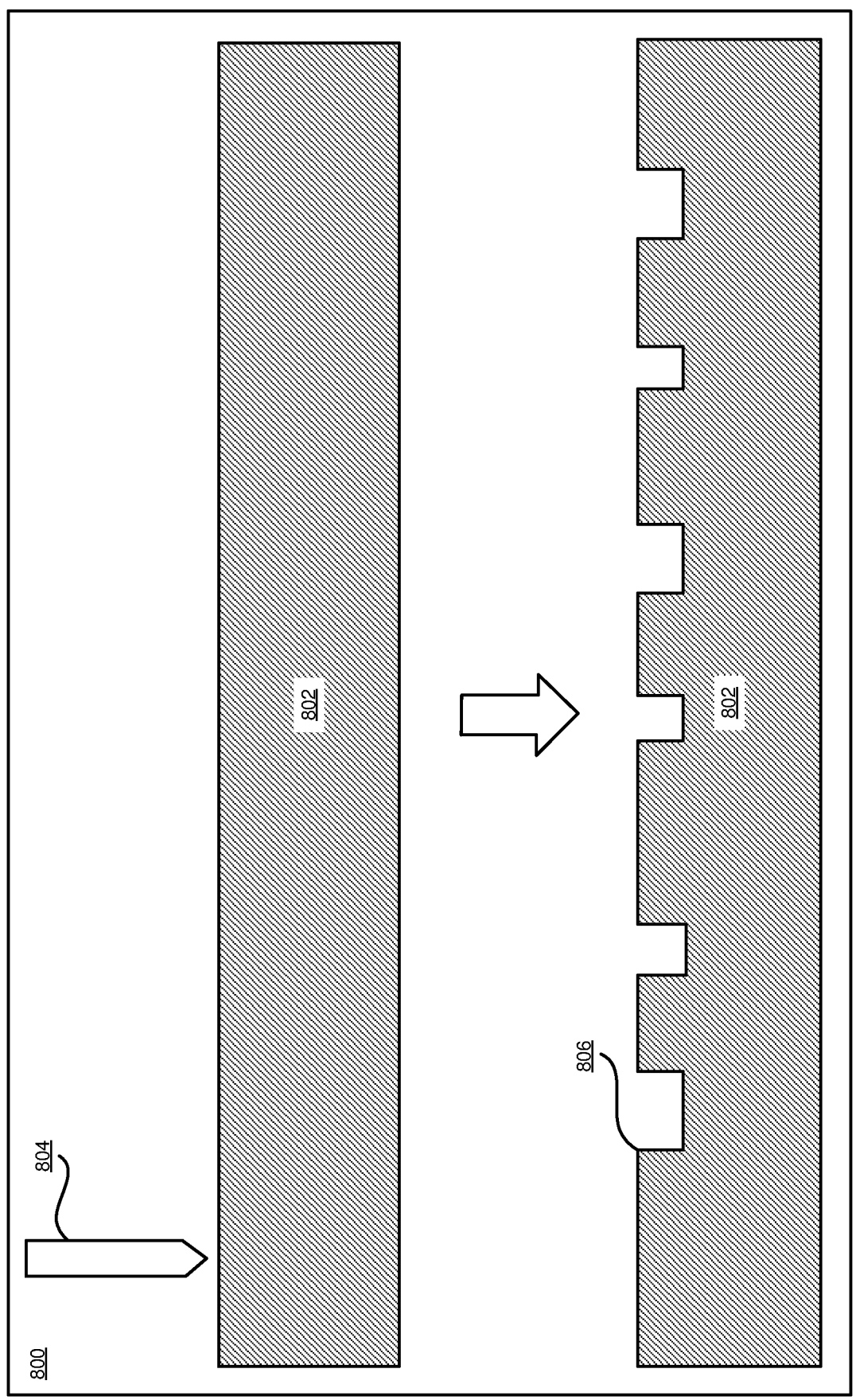
FIG. 8 depicts a block diagram of an example configuration in accordance with an illustrative embodiment

With reference to FIG. 8, this figure depicts a block diagram of an example configuration in accordance with an illustrative embodiment. Application 105 in FIG. 1 interacts with fabrication system 107 to produce or manipulate configuration 800 as described herein.

Configuration 800 comprises substrate 802. Substrate 802 comprises a material with high thermal conductivity (above a threshold) in the cryogenic temperature range. In an embodiment, substrate 802 is formed using a material that exhibits a RRR of at least 100, and a thermal conductivity of greater than a 1 W/(cm*K) at 4 Kelvin, threshold level of thermal conductivity. For example, substrate 802 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming the substrate and the same are contemplated within the scope of the illustrative embodiments.

An embodiment causes a fabrication system, such as fabrication system 107 in FIG. 1, to create a formation 806 on a substrate 802. For example, milling device 804 can be configured to remove a portion of the substrate 802 to create formation 806. As another example, deep reactive-ion etching can be used to create formation 806. In an embodiment, formation 806 includes a plurality of recesses. For example, formation 806 can include a plurality of rectangular trenches in substrate 802. In an embodiment, milling device 804 is a micro-milling device with diamond milling bits or a laser mill. These examples of milling devices are not intended to be limiting. From this disclosure, those of ordinary skill in the art will be able to conceive of many other milling devices suitable for creating a formation on the substrate and the same are contemplated within the scope of the illustrative embodiments. Furthermore, from this disclosure, those of ordinary skill in the art will be able to conceive of many other devices and methods suitable for creating a formation in a substrate and the same are contemplated within the scope of the illustrative embodiments.

Figure 9:
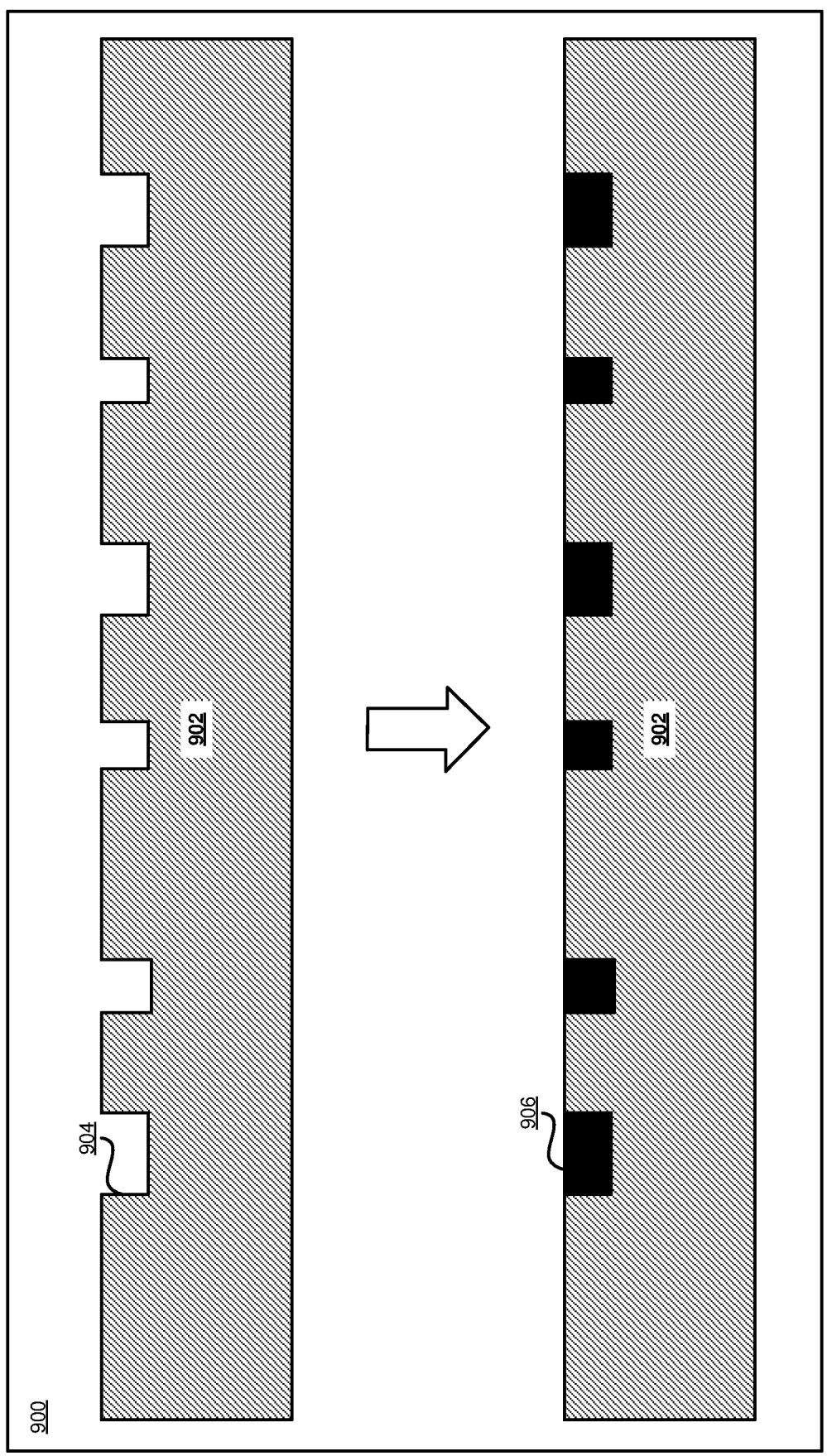
FIG. 9 depicts a block diagram of an example configuration in accordance with an illustrative embodiment.

With reference to FIG. 9, this figure depicts a block diagram of an example configuration in accordance with an illustrative embodiment. Application 105 in FIG. 1 interacts with fabrication system 107 to produce or manipulate configuration 900 as described herein.

An embodiment causes the fabrication system to deposit material, thus forming a plurality of vias 906. For example, the plurality of vias 906 may be formed using tungsten, indium, copper, or tin for operations in the temperature range of 77 K to 0.01 K. These examples of layer materials are not intended to be limiting. From this disclosure, those of ordinary skill in the art will be able to conceive of many other materials suitable for forming the plurality of vias and the same are contemplated within the scope of the illustrative embodiments.

In an embodiment, the plurality of vias 906 is deposited in recesses of formation 904 in substrate 902. For example, the plurality of vias 906 can be formed by electroplating or injection molded soldering (IMS). This example of a deposition method is not intended to be limiting. From this disclosure, those of ordinary skill in the art will be able to conceive of many other methods and process suitable for forming the plurality of vias and the same are contemplated within the scope of the illustrative embodiments.

Figure 10:
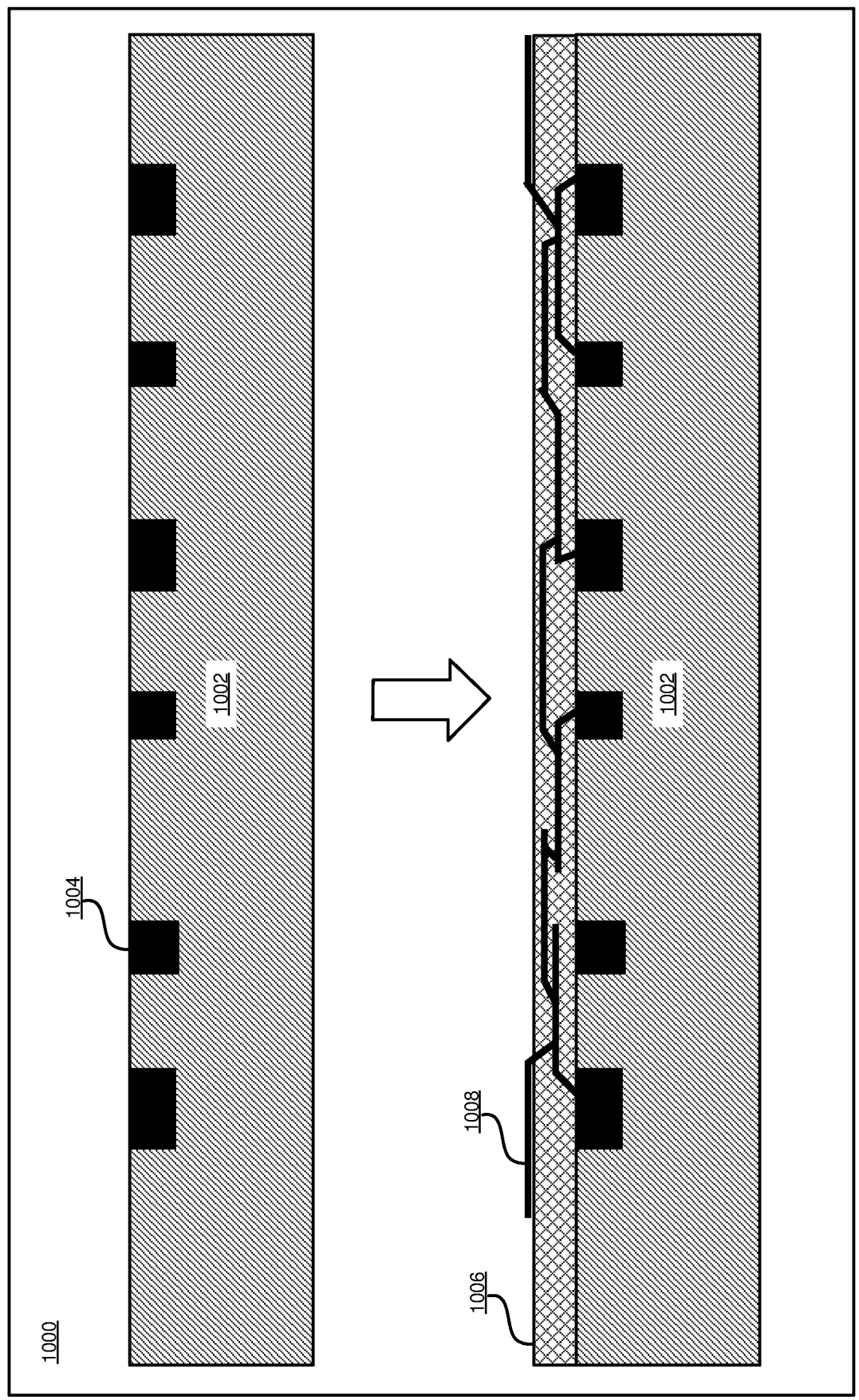
FIG. 10 depicts a block diagram of an example configuration in accordance with an illustrative embodiment.

With reference to FIG. 10, this figure depicts a block diagram of an example configuration in accordance with an illustrative embodiment. Application 105 in FIG. 1 interacts with fabrication system 107 to produce or manipulate configuration 1000 as described herein.

An embodiment causes the fabrication system to deposit material, thus forming second layer 1006. Second layer 1006 comprises stacking of a dielectric material. These examples of layer materials are not intended to be limiting. From this disclosure, those of ordinary skill in the art will be able to conceive of many other materials suitable for forming the second layer and the same are contemplated within the scope of the illustrative embodiments.

In an embodiment, second layer 1006 is deposited on substrate (interposer layer) 1002. For example, second layer 1006 can be formed by spin coating. This example of a deposition method is not intended to be limiting. From this disclosure, those of ordinary skill in the art will be able to conceive of many other methods and process suitable for forming the second layer and the same are contemplated within the scope of the illustrative embodiments. A set of transmission lines 1008 connect to a plurality of vias 1004. In an embodiment, the set of transmission lines 1008 are formed using copper. In an embodiment, the set of transmission lines are exposed to provide signal connection points.

Figure 11:
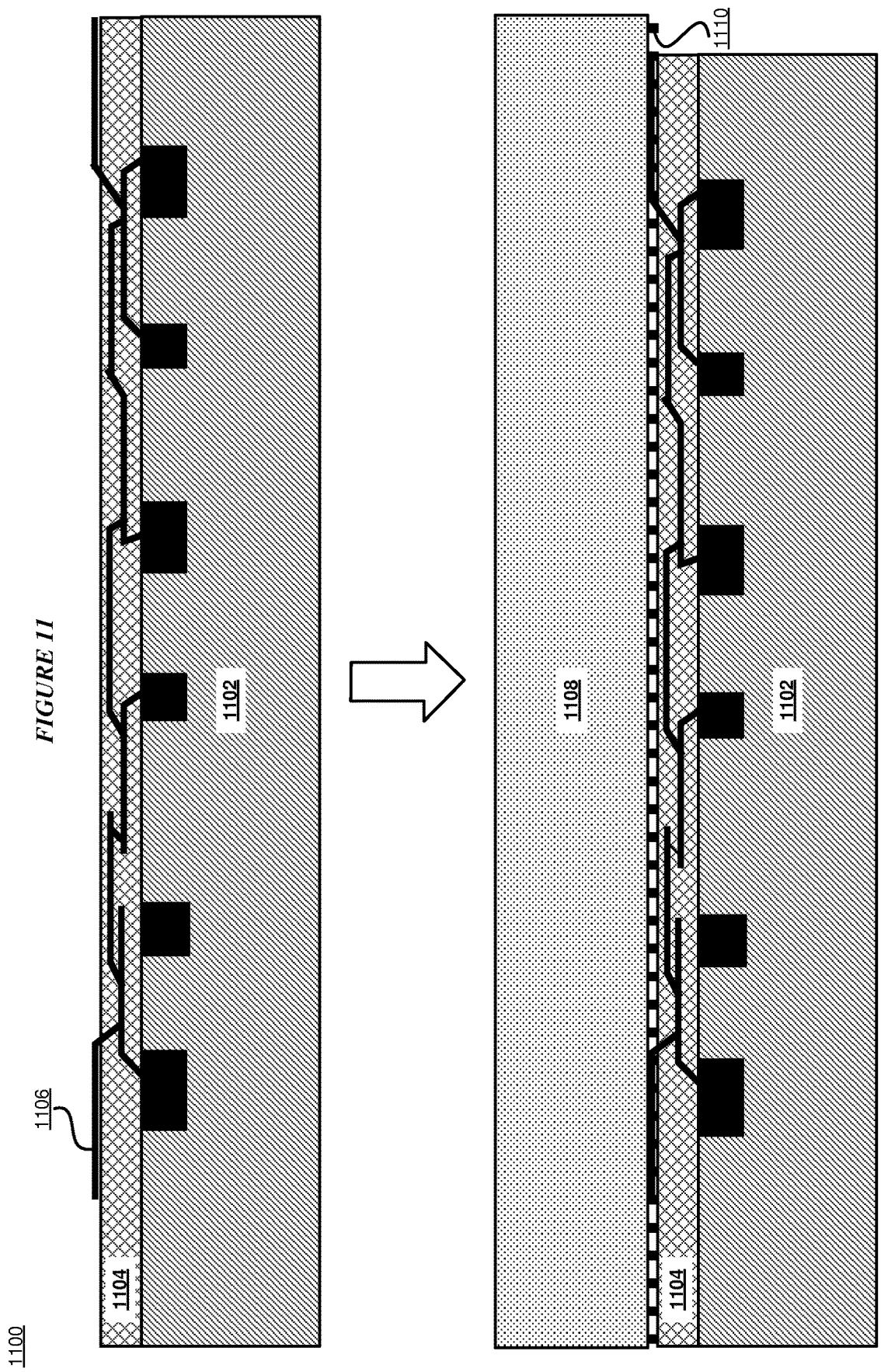
FIG. 11 depicts a block diagram of an example configuration in accordance with an illustrative embodiment.

With reference to FIG. 11, this figure depicts a block diagram of an example configuration in accordance with an illustrative embodiment. Application 105 in FIG. 1 interacts with fabrication system 107 to produce or manipulate configuration 1100 as described herein.

An embodiment causes the fabrication system to couple a third layer (handler) 1108 to the second layer 1104. In an embodiment, third layer 1108 is formed using glass or silicon. These examples of layer materials are not intended to be limiting. From this disclosure, those of ordinary skill in the art will be able to conceive of many other materials suitable for forming the first layer and the same are contemplated within the scope of the illustrative embodiments.

In an embodiment, a handler (third layer) 1108 is bonded to second layer 1104 by an adhesive layer 1110. In an embodiment, adhesive layer 1110 is a temporary adhesive. This example of a bonding method is not intended to be limiting. From this disclosure, those of ordinary skill in the art will be able to conceive of many other methods and materials suitable for bonding the third layer to the second layer and the same are contemplated within the scope of the illustrative embodiments.

Figure 12:
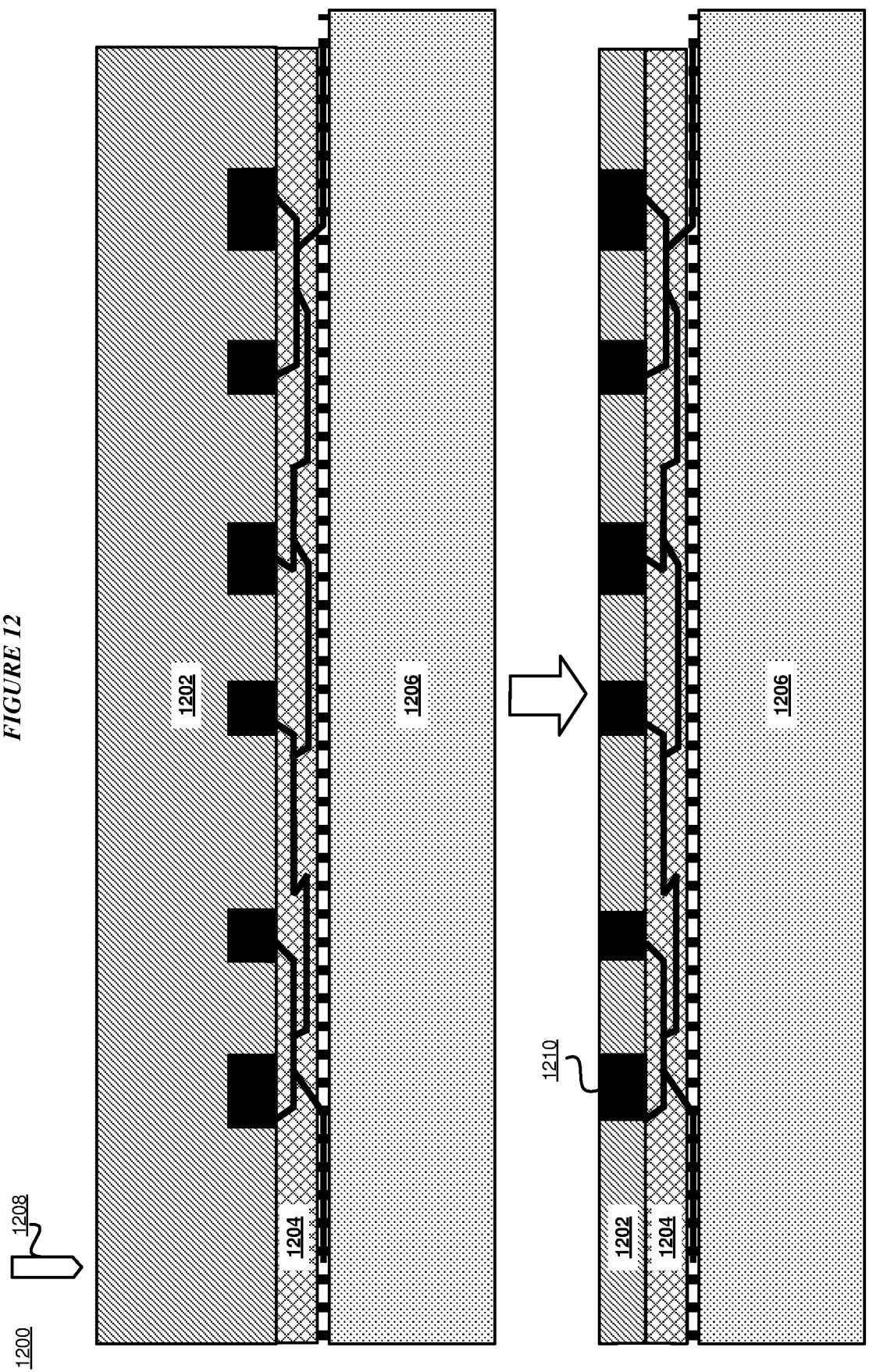
FIG. 12 depicts a block diagram of an example configuration in accordance with an illustrative embodiment.

With reference to FIG. 12, this figure depicts a block diagram of an example configuration in accordance with an illustrative embodiment. Application 105 in FIG. 1 interacts with fabrication system 107 to produce or manipulate configuration 1200 as described herein.

Configuration 1200 comprises substrate 1202. Substrate 1202 comprises a material with high thermal conductivity (above a threshold) in the cryogenic temperature range. In an embodiment, substrate 1202 is formed using a material that exhibits a RRR of at least 100, and a thermal conductivity of greater than a 1 W/(cm*K) at 4 Kelvin, threshold level of thermal conductivity. For example, substrate 1202 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming the substrate and the same are contemplated within the scope of the illustrative embodiments.

An embodiment causes a fabrication system, such as fabrication system 107 in FIG. 1, to reduce a thickness of substrate 1202. For example, milling device 1208 can be configured to remove a portion of the substrate 1202. As another example, deep reactive-ion etching can be used to remove a portion of the substrate 1202. In an embodiment, milling device removes a portion of the substrate 1202 to expose a set of vias 1210. For example, milling device 1208 can be configured to reduce a thickness of the substrate 1208 until a surface of the substrate 1208 is substantially flush with a surface of the set of vias 1210, such as within five percent. In an embodiment, milling device 1208 is a micro-milling device with diamond milling bits or a laser mill. As another example, a chemical mechanical polishing method can be used to grind 1202. These examples of milling devices are not intended to be limiting. From this disclosure, those of ordinary skill in the art will be able to conceive of many other milling devices suitable for reducing a thickness of the substrate and the same are contemplated within the scope of the illustrative embodiments. Furthermore, from this disclosure, those of ordinary skill in the art will be able to conceive of many other devices and methods suitable for reducing a thickness of a substrate and the same are contemplated within the scope of the illustrative embodiments.

Figure 13:
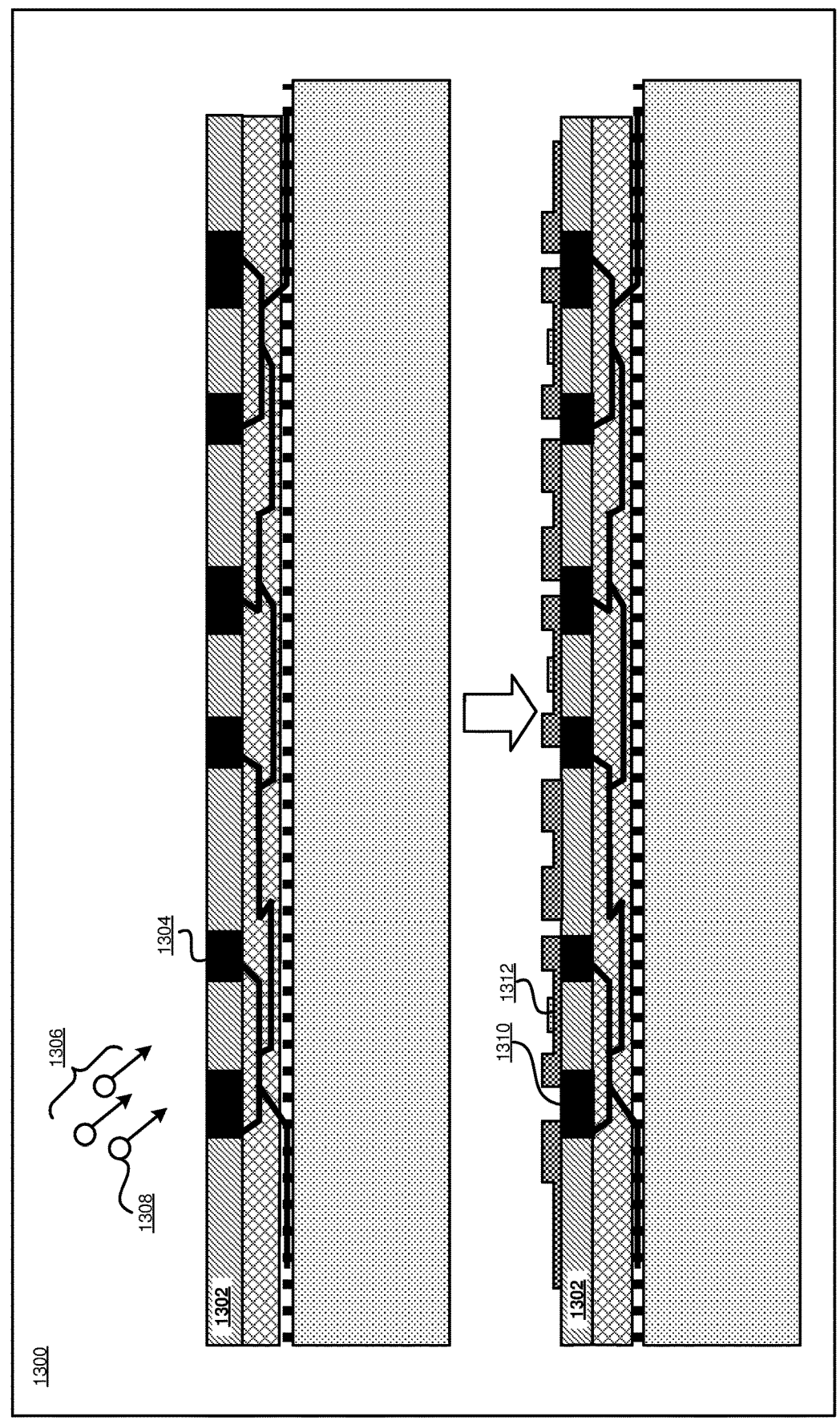
FIG. 13 depicts a block diagram of an example configuration in accordance with an illustrative embodiment.

With reference to FIG. 13, this figure depicts a block diagram of an example configuration in accordance with an illustrative embodiment. Application 105 in FIG. 1 interacts with fabrication system 107 to produce or manipulate configuration 1300 as described herein.

An embodiment causes the fabrication system to deposit material 1306, thus forming a set of pads 1310 and a set of resonators 1312. In an embodiment, material 1306 is a thin film deposition of particles 1308. For example, a set of pads 1310 can be deposited on the set of vias 1304. As another example, a set of resonators 1312 can be deposited on the substrate 1302.

Figure 14:
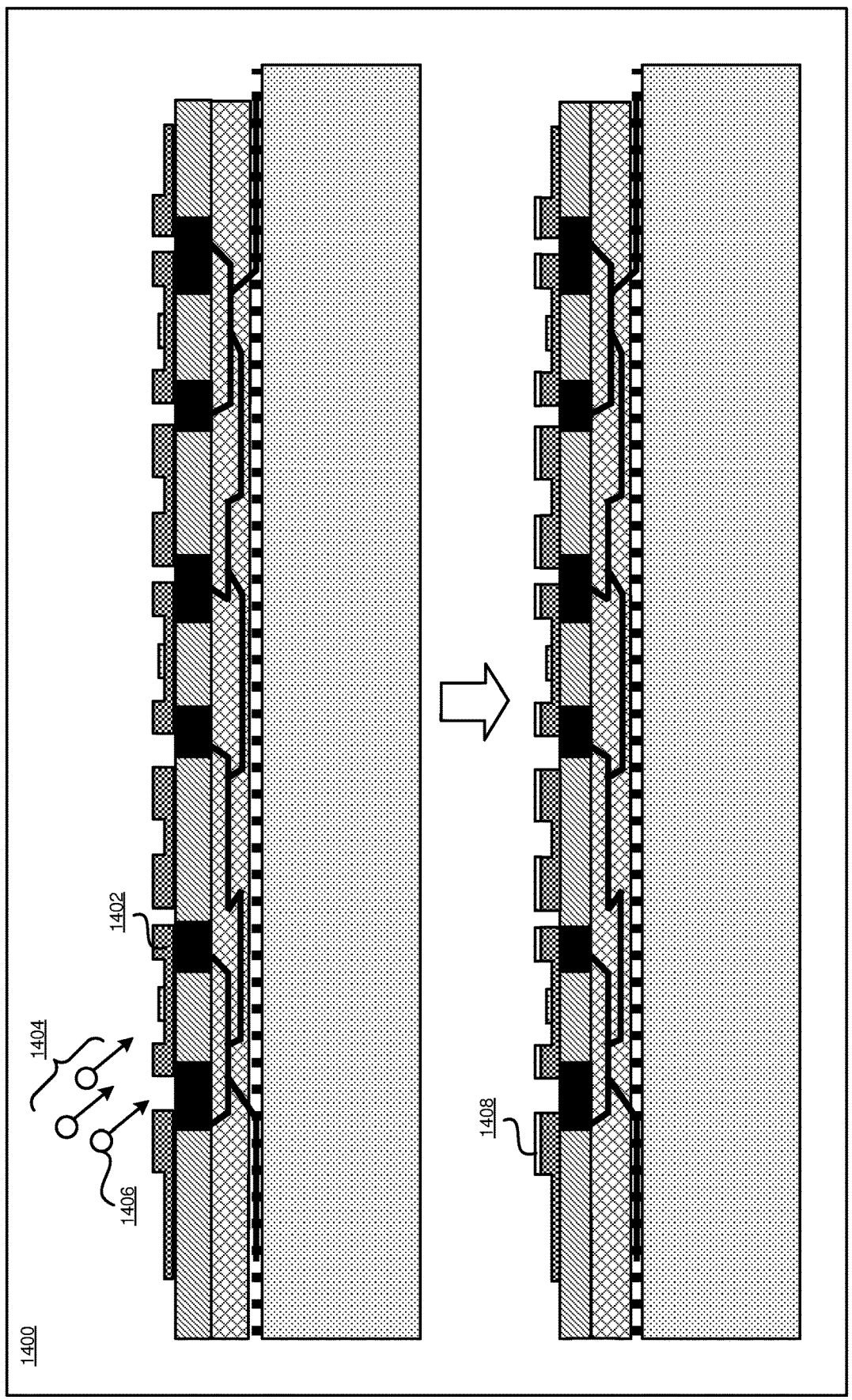
FIG. 14 depicts a block diagram of an example configuration in accordance with an illustrative embodiment.

With reference to FIG. 14, this figure depicts a block diagram of an example configuration in accordance with an illustrative embodiment. Application 105 in FIG. 1 interacts with fabrication system 107 to produce or manipulate configuration 1400 as described herein.

An embodiment causes the fabrication system to deposit material 1404, thus forming a first layer 1408 on the set of pads 1402. In an embodiment, first layer 1408 is formed using at least one of titanium, palladium, gold, silver, copper, or platinum for operations in the temperature range of 77 K to 0.01K. These examples of first layer materials are not intended to be limiting. From this disclosure those of ordinary skill in the art will be able to conceive of many other materials suitable for forming the first layer and the same are contemplated within the scope of the illustrative embodiments.

In an embodiment, first layer 1408 is deposited on the set of pads 1402. For example, first layer 1408 is a thin film deposition of particles 1406. As another example, first layer 1408 is deposited by sputtering. As yet another example, first layer 1408 is deposited by under bump metallurgy (UBM). These examples of deposition methods are not intended to be limiting. From this disclosure, those of ordinary skill in the art will be able to conceive of many other methods and process suitable for forming the first layer and the same are contemplated within the scope of the illustrative embodiments.

Figure 15:
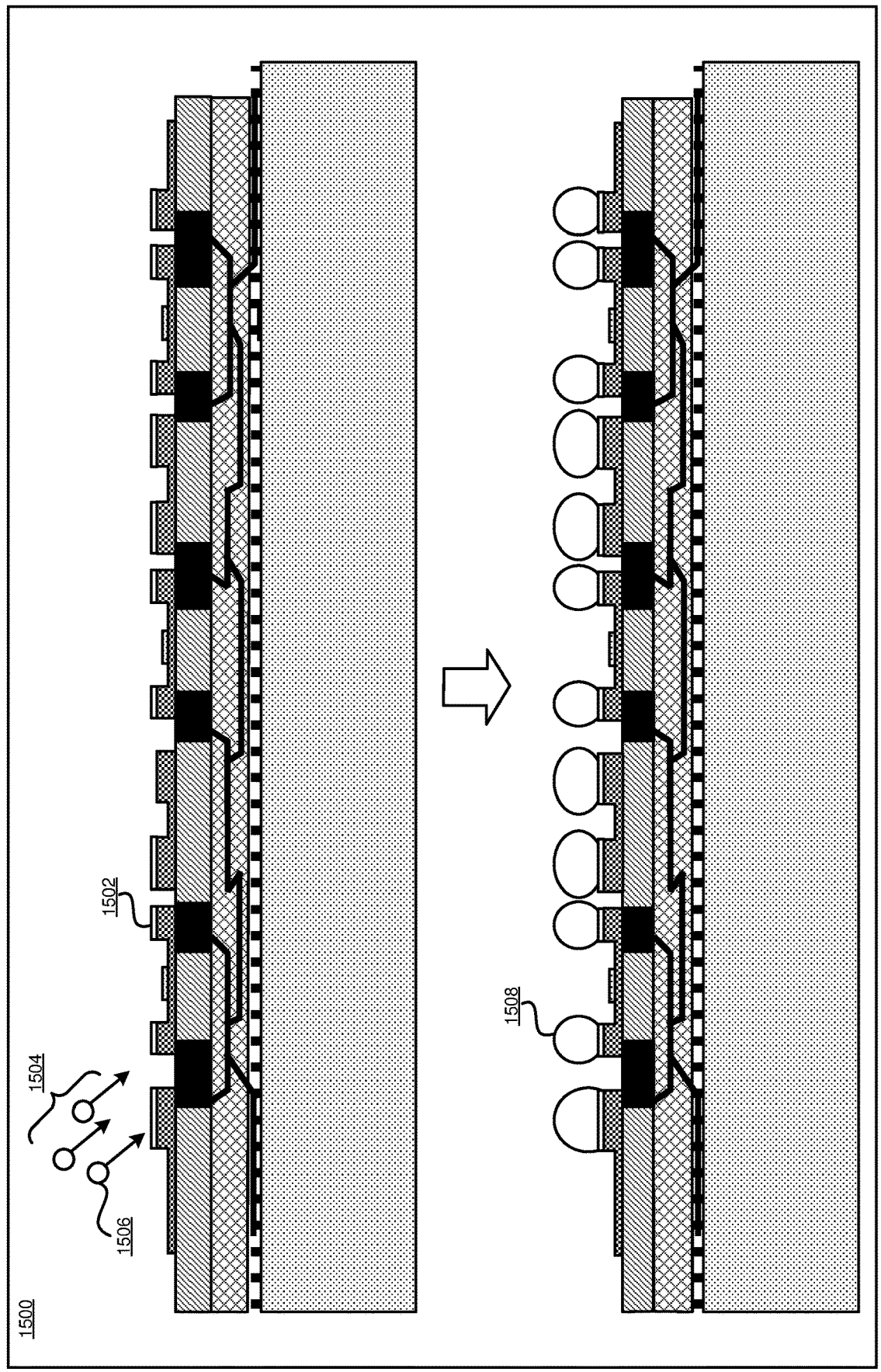
FIG. 15 depicts a block diagram of an example configuration in accordance with an illustrative embodiment.

With reference to FIG. 15, this figure depicts a block diagram of an example configuration in accordance with an illustrative embodiment. Application 105 in FIG. 1 interacts with fabrication system 107 to produce or manipulate configuration 1500 as described herein.

An embodiment causes the fabrication system to deposit material 1504, thus forming a second layer 1508 on the first layer 1502. In an embodiment, second layer 1508 is a set of solder bumps. In an embodiment, second layer 1508 is formed using Indium, Tin, and Bismuth for operations in the temperature range of 77 K to 0.01K. In an embodiment, second layer 1508 is an indium bump. This example of a first layer material is not intended to be limiting. From this disclosure those of ordinary skill in the art will be able to conceive of many other materials suitable for forming the second layer and the same are contemplated within the scope of the illustrative embodiments.

In an embodiment, second layer 1508 is deposited on the first layer 1502. For example, second layer 1508 is an IMS deposition of particles 1506. This example of a deposition method is not intended to be limiting. From this disclosure, those of ordinary skill in the art will be able to conceive of many other methods and process suitable for forming the first layer and the same are contemplated within the scope of the illustrative embodiments.

Figure 16:
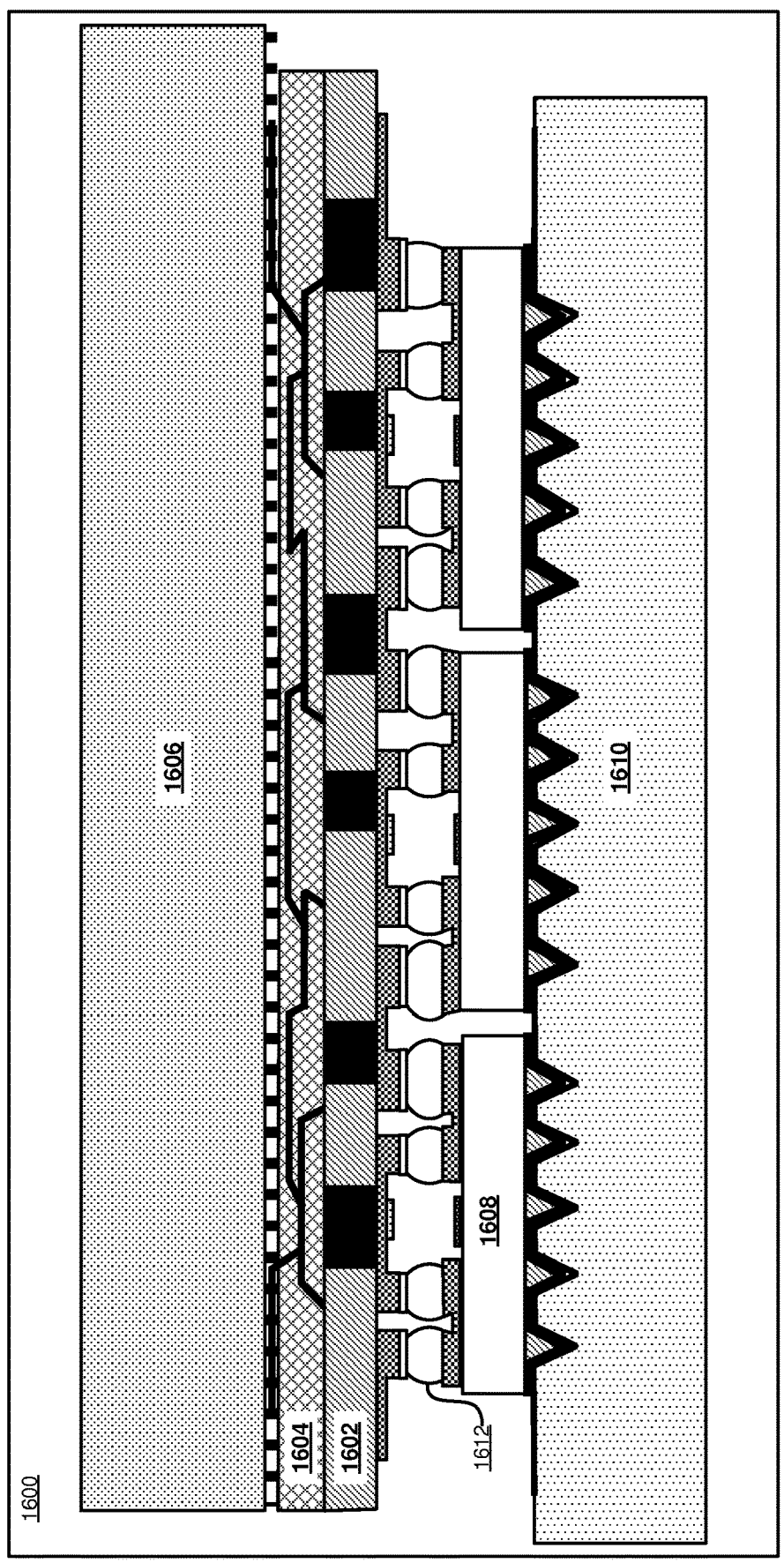
FIG. 16 depicts a block diagram of an example flip chip configuration in accordance with an illustrative embodiment.

With reference to FIG. 16, this figure depicts a block diagram of an example flip chip configuration in accordance with an illustrative embodiment. Application 105 in FIG. 1 interacts with fabrication system 107 to produce or manipulate configuration 1600 as described herein.

An embodiment causes the fabrication system to couple a plurality of qubit chips to interposer layer 1602. In an embodiment, qubit chip 1608 is similar to qubit chip configuration 400 in FIG. 4. In an embodiment, heat sink 1610 is similar to heat sink 602 in FIG. 6. In an embodiment, second layer 1604 is similar to second layer 1006 in FIG. 10. In an embodiment, third layer 1606 is similar to third layer 1108 in FIG. 11. In an embodiment, fabrication system compression bonds a set of pads of the qubit chips with a set of pads of the interposer layer 1602 at the set of indium bumps 1612.

Figure 17:
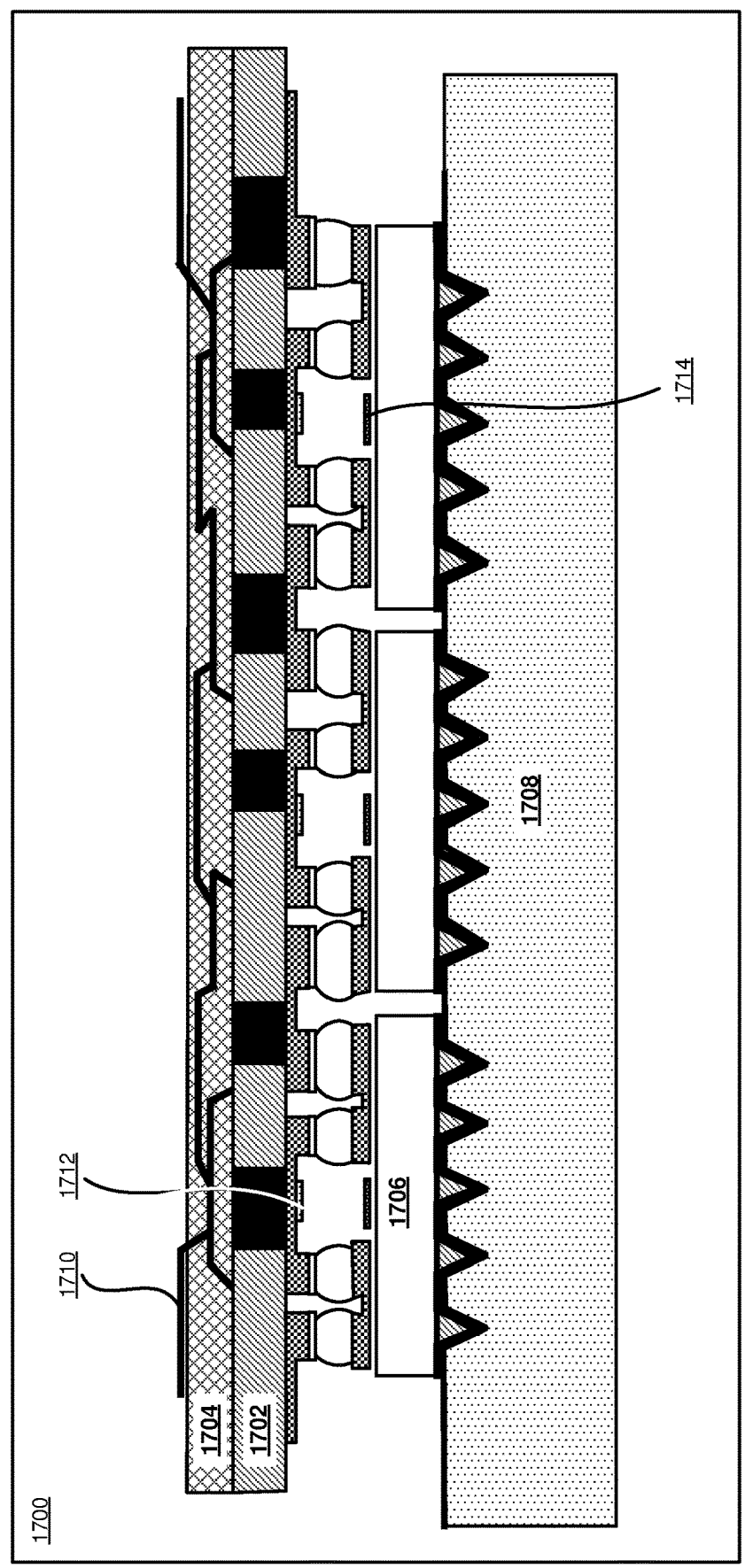
FIG. 17 depicts a block diagram of an example flip chip configuration in accordance with an illustrative embodiment.

With reference to FIG. 17, this figure depicts a block diagram of an example flip chip configuration in accordance with an illustrative embodiment. Application 105 in FIG. 1 interacts with fabrication system 107 to produce or manipulate configuration 1700 as described herein.

An embodiment causes the fabrication system to decouple the third layer from the second layer 1704. In an embodiment, adhesive material bonding the third layer and the second layer 1704 is cleaned off the surface of the second layer 1704. In an embodiment, a set of resonators 1712 are aligned with a corresponding set of junctions 1714.

Figure 18:
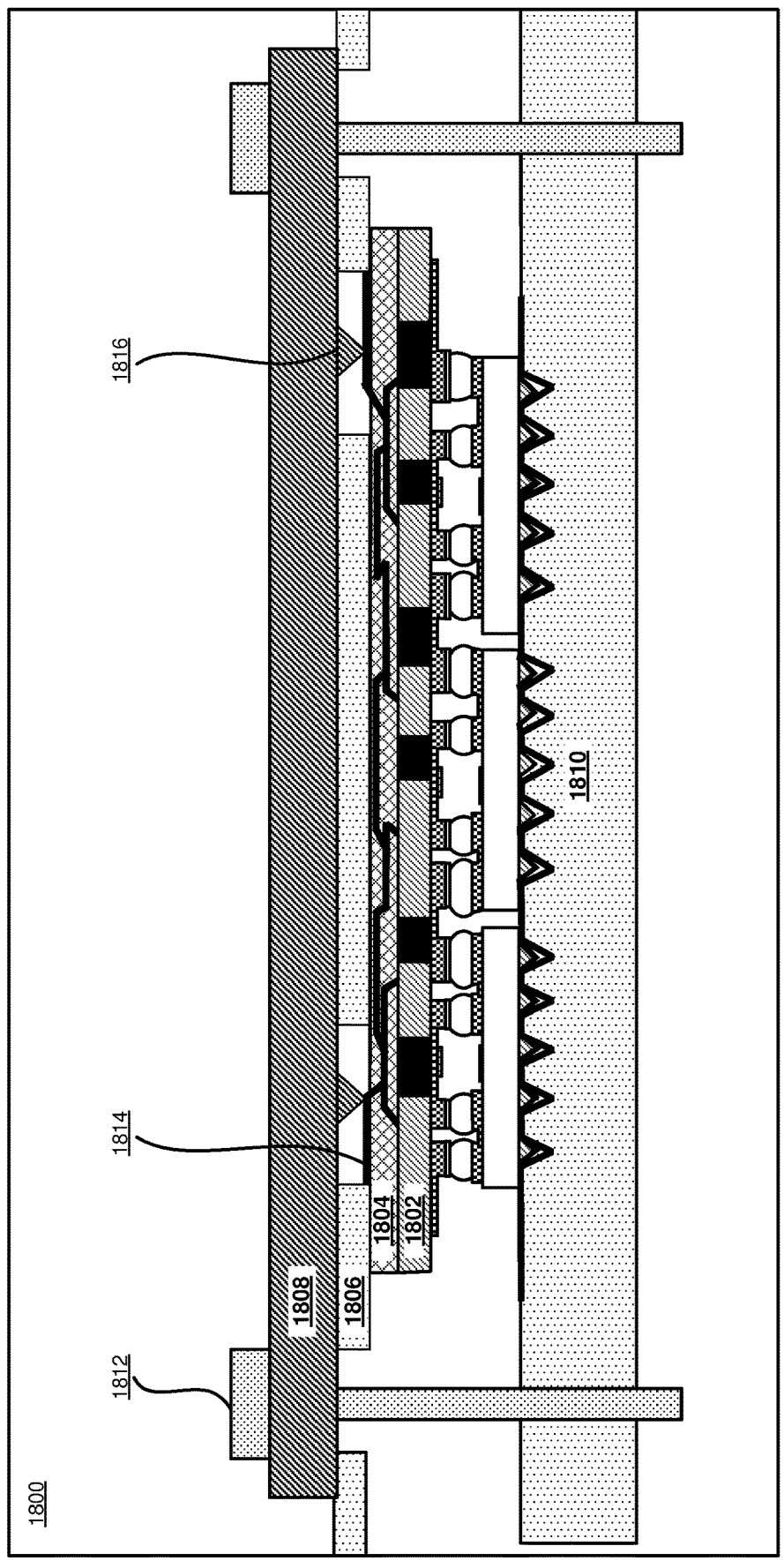
FIG. 18 depicts a block diagram of an example flip chip configuration in accordance with an illustrative embodiment.

With reference to FIG. 18, this figure depicts a block diagram of an example flip chip configuration in accordance with an illustrative embodiment. Application 105 in FIG. 1 interacts with fabrication system 107 to produce or manipulate configuration 1800 as described herein.

An embodiment causes the fabrication system to couple a heat sink 1806 and a signal connector 1808 to the configuration 1800. Heat sink 1806 comprises a material with high thermal conductivity (above a threshold) in the cryogenic temperature range. In an embodiment, heat sink 1806 is formed using a material that exhibits a RRR of at least 100, and a thermal conductivity of greater than a 1 W/(cm*K) at 4 Kelvin, threshold level of thermal conductivity. For example, heat sink 1806 may be formed using gold, silver, copper, or aluminum for operations in the temperature range of 77 K to 0.01K. These examples of heat sink materials are not intended to be limiting. From this disclosure those of ordinary skill in the art will be able to conceive of many other materials suitable for forming the heat sink and the same are contemplated within the scope of the illustrative embodiments.

In an embodiment, heat sink 1806 is disposed between signal connector 1808 and second layer 1804. In an embodiment, signal connector 1808 is coupled to heat sink 1810 by a set of fasteners 1812. Signal connector 1808 connects to a set of transmission lines 1814 at pins 1816. Signal connector 1808 is configured to transfer qubit signals from the transmission lines 1814 to an external circuit for signal processing.

Figure 19:
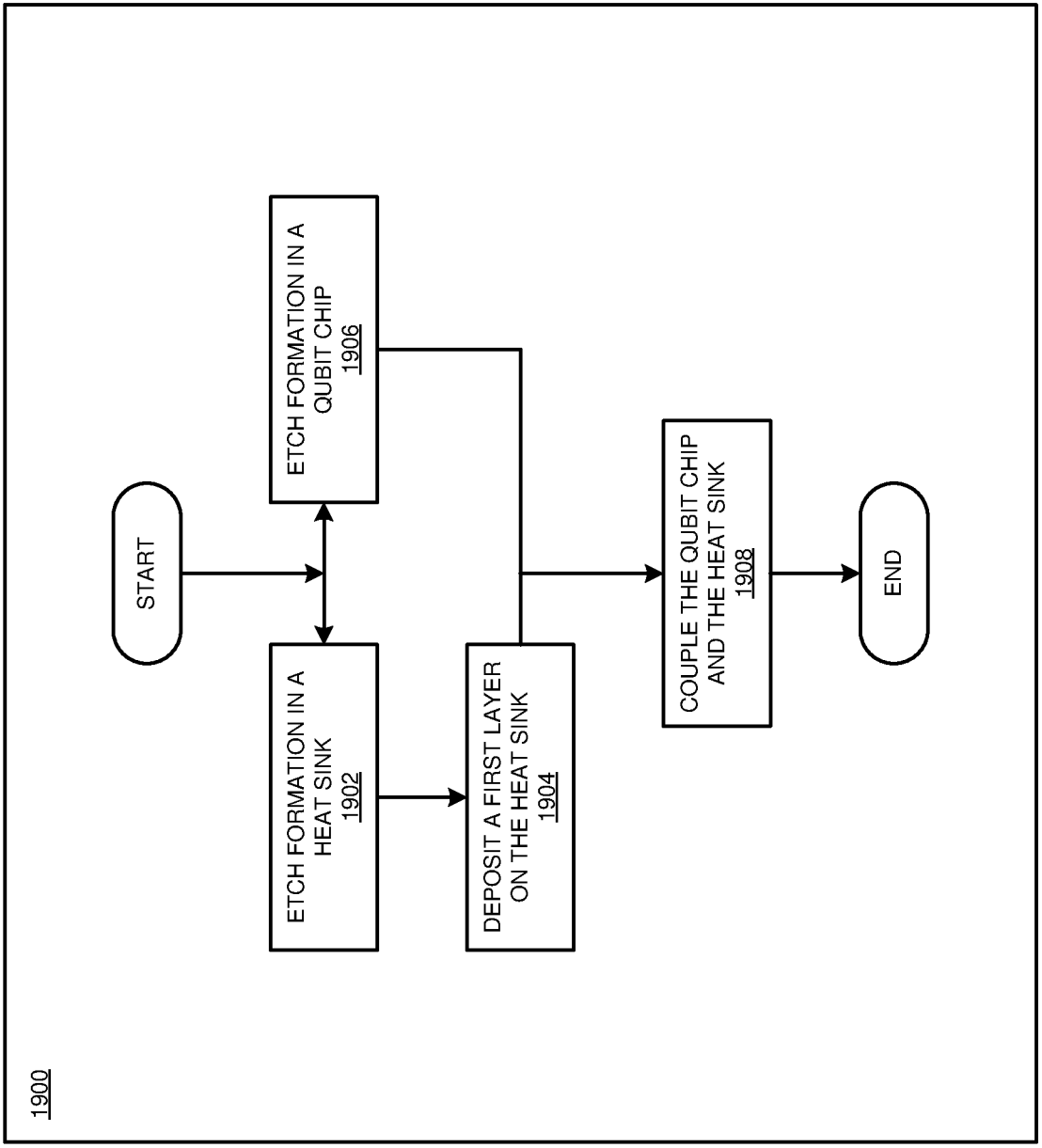
FIG. 19 a flowchart of a qubit chip formation process in accordance with an illustrative embodiment.

With reference to FIG. 19, this figure depicts a flowchart of a qubit chip formation process in accordance with an illustrative embodiment. Process 1900 can be implemented in application 105 in FIG. 1, to create formations in a heat sink and qubit chip as described with respect to FIGS. 3, 4, 5, 6, and 7.

The application causes a fabrication system to etch a formation in a heat sink (block 1902). In an embodiment, the application causes a fabrication system to form a plurality of recesses in a heat sink. The application causes a fabrication system to deposit a first layer on the heat sink (block 1904). In an embodiment, the application causes a fabrication system to deposit a first layer on the plurality of recesses. The application causes a fabrication system to etch a formation in a qubit chip (block 1906). In an embodiment, the application causes a fabrication system to form a plurality of protrusions on a plurality of qubit chips. The application causes a fabrication system to deposit a second layer on the qubit chip (block 1908). In an embodiment, the application causes a fabrication system to deposit a second layer on the plurality of protrusions. The application causes a fabrication system to couple the qubit chip and the heat sink (block 1910). In an embodiment, the application causes a fabrication system to couple a plurality of qubit chips to the heat sink. The application ends process 1900 thereafter.

Figure 20:
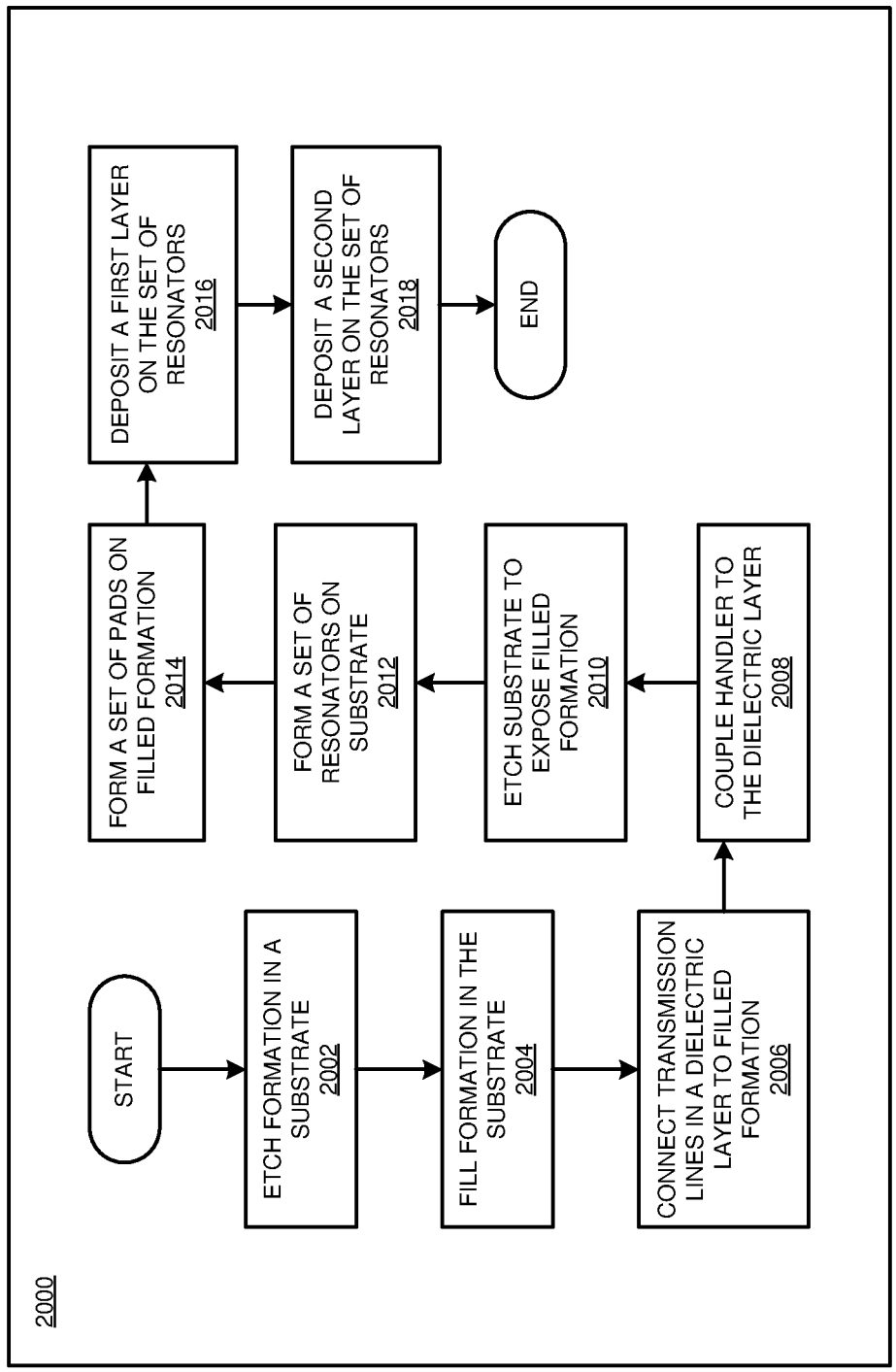
FIG. 20 depicts a flowchart of an interposer layer formation process in accordance with an illustrative embodiment.

With reference to FIG. 20, this figure depicts a flowchart of an interposer layer formation process in accordance with an illustrative embodiment. Process 2000 can be implemented in application 105 in FIG. 1, to create formations in a heat sink and qubit chip as described with respect to FIGS. 8, 9, 10, 11, 12, 13, 14, and 15.

The application causes a fabrication system to etch a formation in a substrate (interposer layer) (block 2002). In an embodiment, the application causes a fabrication system to form a plurality of recesses in a substrate. The application causes a fabrication system to fill the formation in the substrate (block 2004). In an embodiment, the application causes a fabrication system to fill the plurality of recesses in the substrate. The application causes a fabrication system to connect transmission lines in a dielectric layer to the filled formation (block 2006). The application causes a fabrication system to couple (attach) a handler (third layer) to the dielectric layer (block 2008). The application causes a fabrication system to etch the substrate to expose the filled formation (block 2010). The application causes a fabrication system to form a set of resonators on the substrate (block 2012). The application causes a fabrication system to form a set of pads on the filled formation (block 2014). The application causes a fabrication system to deposit a first layer on the set of resonators (block 2016). The application causes a fabrication system to deposit a second layer on the set of resonators (block 2018). The application ends process 2000 thereafter.

Figure 21:
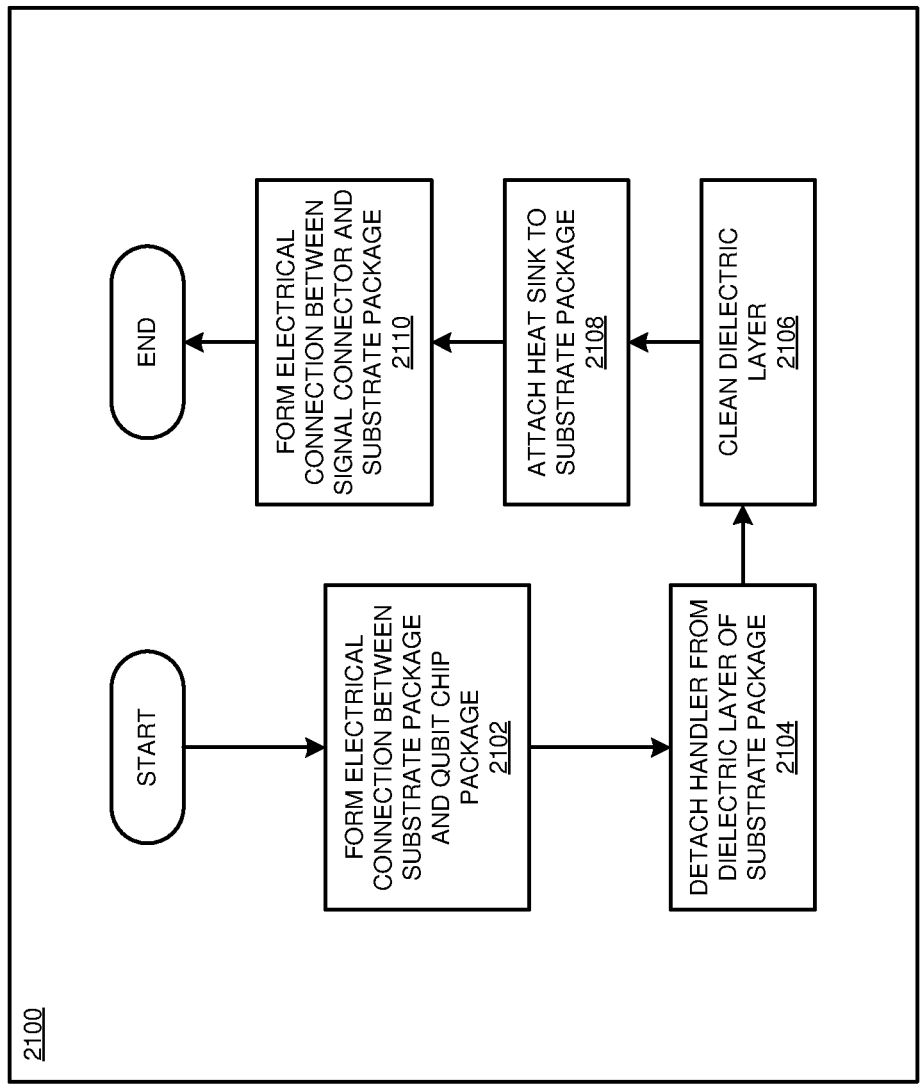
FIG. 21 depicts a flowchart of a qubit chip formation process in accordance with an illustrative embodiment.

With reference to FIG. 21, this figure depicts a flowchart of a qubit chip formation process in accordance with an illustrative embodiment. Process 2100 can be implemented in application 105 in FIG. 1, to create formations in a heat sink and qubit chip as described with respect to FIGS. 16, 17, and 18.

The application causes a fabrication system to form an electrical connection between a substrate package and a qubit chip package (block 2102). The application causes a fabrication system to detach the handler from the dielectric layer (block 2104). The application causes a fabrication system to clean a bonding agent from the dielectric layer (block 2106). The application causes a fabrication system to attach a heat sink to the substrate package (block 2108). The application causes a fabrication system to form an electrical connection between a signal connector and the substrate package (block 2110). The application ends process 2100 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum device comprising:
   an interposer layer comprising a set of vias;
   a dielectric layer formed on a first side of the interposer, the dielectric layer including a set of transmission lines communicatively coupled to the set of vias;
   a plurality of qubit chips coupled to an opposite side of the interposer layer, each qubit chip comprising:
   a plurality of qubits on a first side of the qubit chip; and
   a plurality of protrusions on a second side of the qubit chip; and
   a heat sink thermally coupled with the plurality of qubit chips, the heat sink comprising a plurality of recesses aligned with the plurality of protrusions of the plurality of qubit chips.

2. The quantum device of claim 1, further comprising:
   a signal connector communicatively coupled to the set of transmission lines.

3. The quantum device of claim 1, wherein a shape of the plurality of protrusions is configured to self-align the plurality of protrusions with the plurality of recesses.

4. The quantum device of claim 1, further comprising:
   a second heat sink coupled to the dielectric layer.

5. The quantum device of claim 1, wherein the plurality of protrusions have a pyramidal shape.

6. The quantum device of claim 1, further comprising:
   a first set of pads on the plurality of qubit chips, each pad connected to a corresponding qubit; and
   a second set of pads on the interposer layer, the second set of pads formed on the vias.

7. The quantum device of claim 6, further comprising:
   a first layer disposed on the second set of pads; and
   a set of solder bumps disposed on the first layer, the set of solder bumps configured to bond the first set of pads and the second set of pads.

8. The solder bumps of claim 7, wherein the set of solder bumps is of at least one member selected from a set comprising Indium, Tin, and Bismuth.

9. The quantum device of claim 1, further comprising:
   a first layer disposed on the plurality of protrusions of the plurality of qubit chips; and
   a second layer disposed on the plurality of recesses of the heat sink.

10. The quantum device of claim 9, wherein the first layer is of at least one member selected from a set comprising Titanium, Silver, Copper, Platinum, and Gold.

11. The quantum device of claim 9, wherein the second layer is of at least one member selected from a set comprising Titanium, Silver, Copper, Platinum, and Gold.

* * * * *